United States Patent
Welch et al.

(10) Patent No.: US 7,162,113 B2
(45) Date of Patent: Jan. 9, 2007

(54) DEPLOYMENT OF ELECTRO-OPTIC AMPLITUDE VARYING ELEMENTS (AVES) AND ELECTRO-OPTIC MULTI-FUNCTIONAL ELEMENTS (MFES) IN PHOTONIC INTEGRATED CIRCUITS (PICS)

(75) Inventors: David F. Welch, Menlo Park, CA (US); Fred A. Kish, Jr., Palo Alto, CA (US); Radhakrishnan L. Nagarajan, Cupertino, CA (US); Alan C. Nilsson, Mountain View, CA (US); Robert L. Taylor, Windsor Mill, MD (US)

(73) Assignee: Infinera Corporation, Sunnyvale, CA (US)

( * ) Notice: Subject to any disclaimer, the term of this patent is extended or adjusted under 35 U.S.C. 154(b) by 0 days.

(21) Appl. No.: 11/268,325

(22) Filed: Nov. 7, 2005

(65) Prior Publication Data

US 2006/0093362 A1    May 4, 2006

Related U.S. Application Data

(63) Continuation-in-part of application No. 10/267,331, filed on Oct. 8, 2002, and a continuation-in-part of application No. 10/267,330, filed on Oct. 8, 2002, now Pat. No. 7,079,715, and a continuation-in-part of application No. 10/267,304, filed on Oct. 8, 2002.

(60) Provisional application No. 60/625,322, filed on Nov. 5, 2004.

(51) Int. Cl.
*G02B 6/12* (2006.01)

(52) U.S. Cl. .............................. 385/14; 372/50; 372/26; 372/32; 398/91

(58) Field of Classification Search .................. 385/14
See application file for complete search history.

(56) References Cited

U.S. PATENT DOCUMENTS

| 4,691,983 | A | 9/1987 | Kobayashi et al. |
| 4,973,119 | A | 11/1990 | Taki |
| 5,428,695 | A | 6/1995 | Ohta |
| 5,463,705 | A | 10/1995 | Clauberg et al. |
| 5,663,824 | A | 9/1997 | Koch et al. |
| 5,790,289 | A | 8/1998 | Taga et al. |
| 5,933,270 | A | 8/1999 | Toyohara |
| 6,208,795 | B1 | 3/2001 | Nakano et al. |
| 6,215,585 | B1 * | 4/2001 | Yoshimura et al. ........... 385/14 |
| 6,271,945 | B1 | 8/2001 | Terahara |
| 6,275,329 | B1 | 8/2001 | Sieben |
| 6,282,361 | B1 | 8/2001 | Nishimura et al. |

(Continued)

FOREIGN PATENT DOCUMENTS

EP    0959578 A2    11/1999

(Continued)

OTHER PUBLICATIONS

U.S. Appl. No. 60/695,382, filed Jun. 30, 2005, Nilsson et al.

(Continued)

*Primary Examiner*—Frank G. Font
*Assistant Examiner*—James P. Highes
(74) *Attorney, Agent, or Firm*—W. Douglas Carothers, Jr.

(57) ABSTRACT

Electro-optic amplitude varying elements (AVEs) or electro-optic multi-function elements (MFEs) are integrated into signal channels of photonic integrated circuits (PICs) or at the output of such PICs to provide for various optical controlling and monitoring functions. In one case, such PIC signal channels may minimally include a laser source and a modulator (TxPIC) and in another case, may minimally include a photodetector to which channels, in either case, an AVE or an MFE may be added.

13 Claims, 18 Drawing Sheets

U.S. PATENT DOCUMENTS

| | | |
|---|---|---|
| 6,459,716 B1 | 10/2002 | Lo et al. |
| 6,556,736 B1 | 4/2003 | Doerr et al. |
| 6,563,631 B1 | 5/2003 | Delprat et al. |
| 6,580,844 B1 | 6/2003 | Leurhold |
| 6,590,693 B1 | 7/2003 | Ash et al. |
| 6,600,594 B1 | 7/2003 | Ko et al. |
| 6,634,807 B1 | 10/2003 | Al-Salameh et al. |
| 6,661,556 B1 | 12/2003 | Bond et al. |
| 6,661,963 B1 | 12/2003 | Sharp et al. |
| 6,661,974 B1 * | 12/2003 | Akiyama et al. .............. 398/91 |
| 6,693,736 B1 * | 2/2004 | Yoshimura et al. ........... 385/14 |
| 6,768,579 B1 | 7/2004 | Krummrich |
| 7,031,358 B1 * | 4/2006 | Nakayama ............... 372/50.12 |
| 2002/0015201 A1 | 2/2002 | Zhou et al. |
| 2002/0057491 A1 | 5/2002 | Dorgeuille et al. |
| 2002/0106143 A1 | 8/2002 | Doerr et al. |
| 2002/0109908 A1 | 8/2002 | Koteles et al. |
| 2003/0012510 A1 | 1/2003 | Steenbergen et al. |
| 2003/0095736 A1 | 5/2003 | Kish, Jr. et al. |
| 2003/0179441 A1 | 9/2003 | Pechstedt et al. |
| 2003/0184847 A1 | 10/2003 | Pechstedt |
| 2004/0062557 A1 | 4/2004 | Takashima et al. |
| 2004/0151429 A1 | 8/2004 | Janz et al. |
| 2005/0249509 A1 | 11/2005 | Nagarajan et al. |

FOREIGN PATENT DOCUMENTS

| | | |
|---|---|---|
| WO | WO 02/098026 A1 | 12/2002 |
| WO | WO 03/056738 A1 | 7/2003 |
| WO | WO 2004/051891 | 6/2004 |

OTHER PUBLICATIONS

Watanabe et al., "Transmission Performance . . . Optical Amplifier", Journal of Lightwave Technology, vol. 18(8), pp. 1069-1077, Aug. 2000.

Nagarajan et al., "Large-Scale Photonic Integrated Circuits", Journal of Selected Topics in Quantum Electronics, vol. 11(1), pp. 50-65, Jan./Feb. 2005.

Maru et al, "A Dynmaic Gain Equalizer for next-Generation WDM" Hitachi Cable review, No. 21, pp. 7-10, Aug. 2002.

Nagarajan et al., 400 Gb/s (10-Channel x 40 GB/s) DWDM Photonic Integrated Circuits, OTuM2, (3 pages), Mar. 8, 2005 OFC.

* cited by examiner

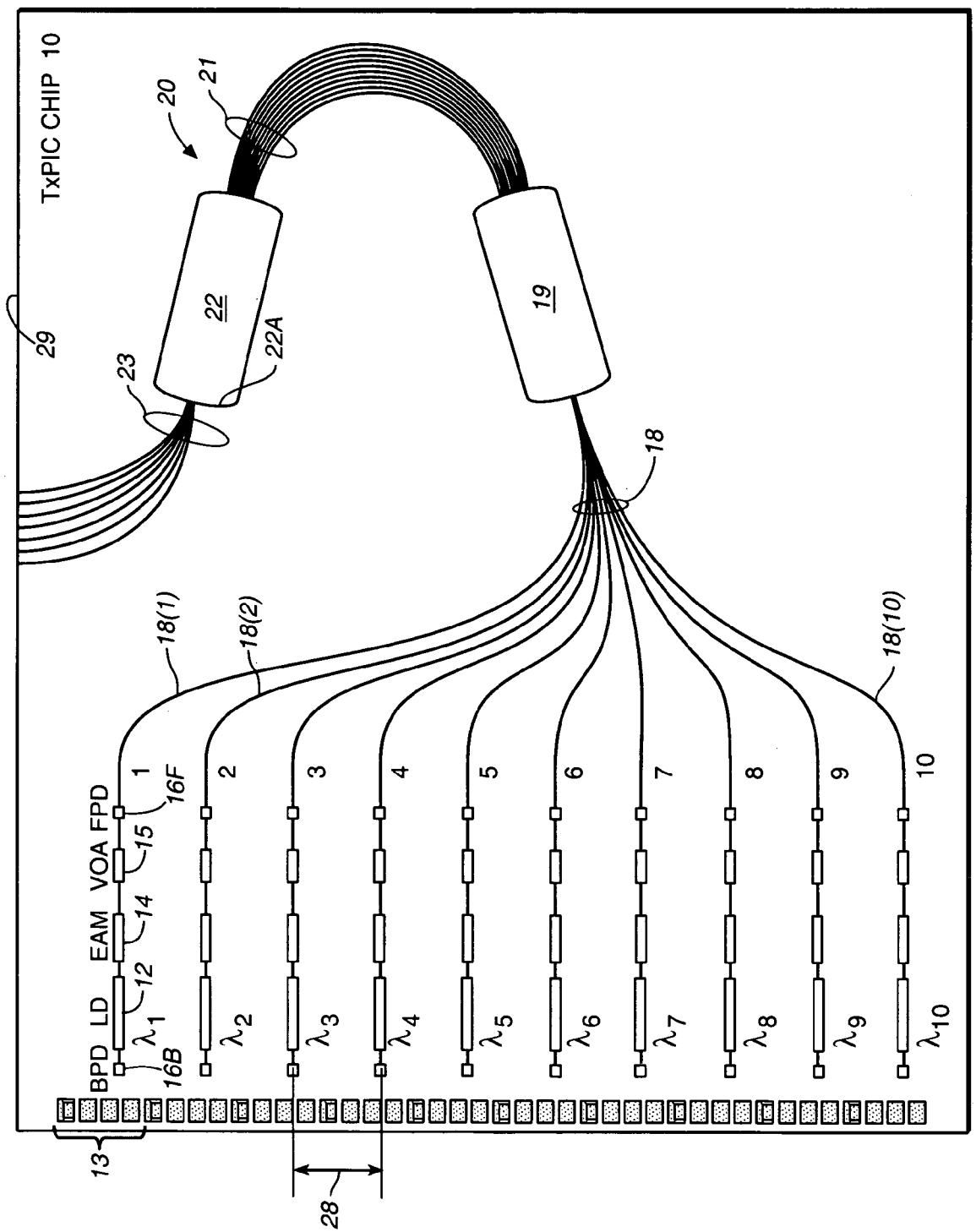
FIG._1

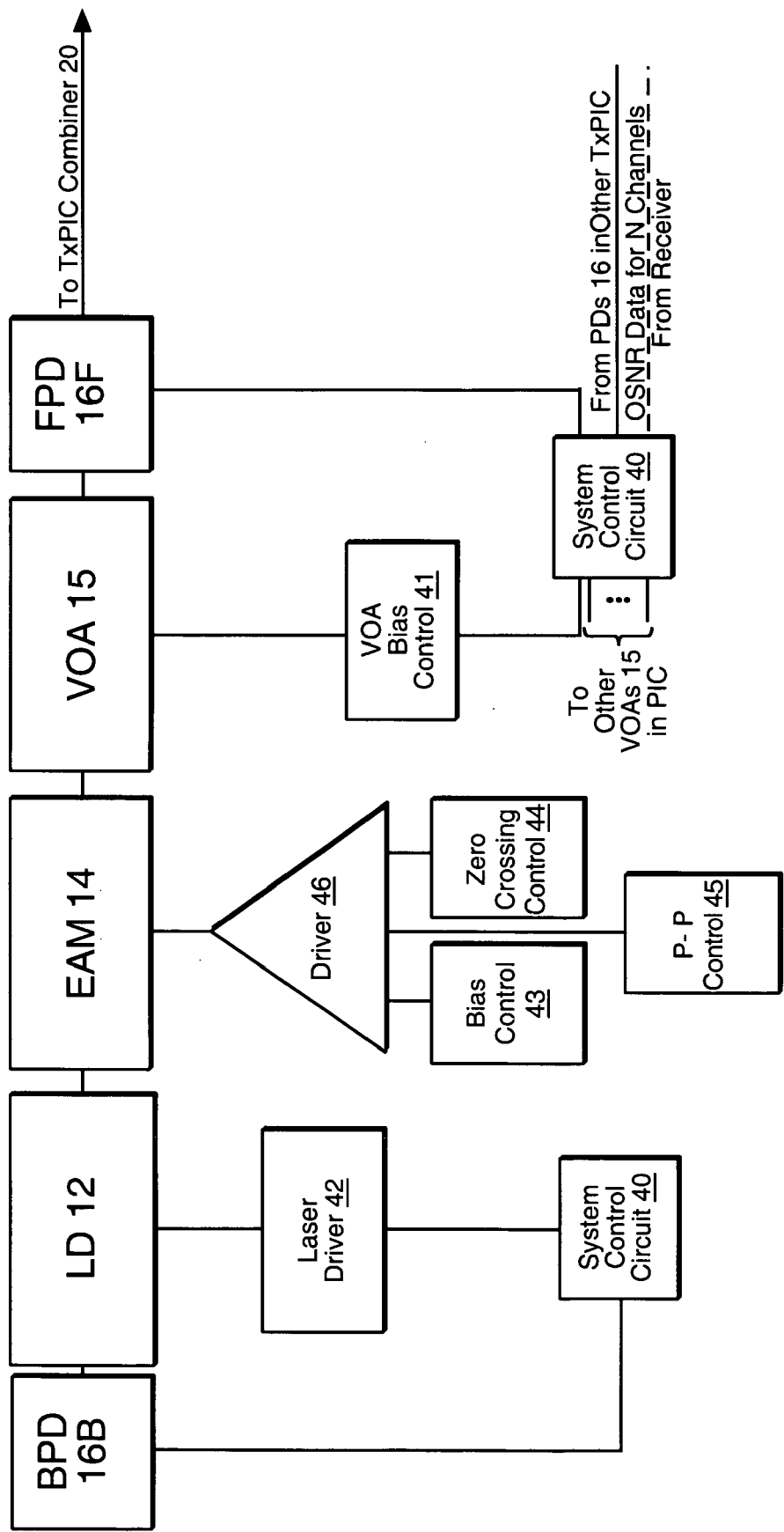
FIG._1A

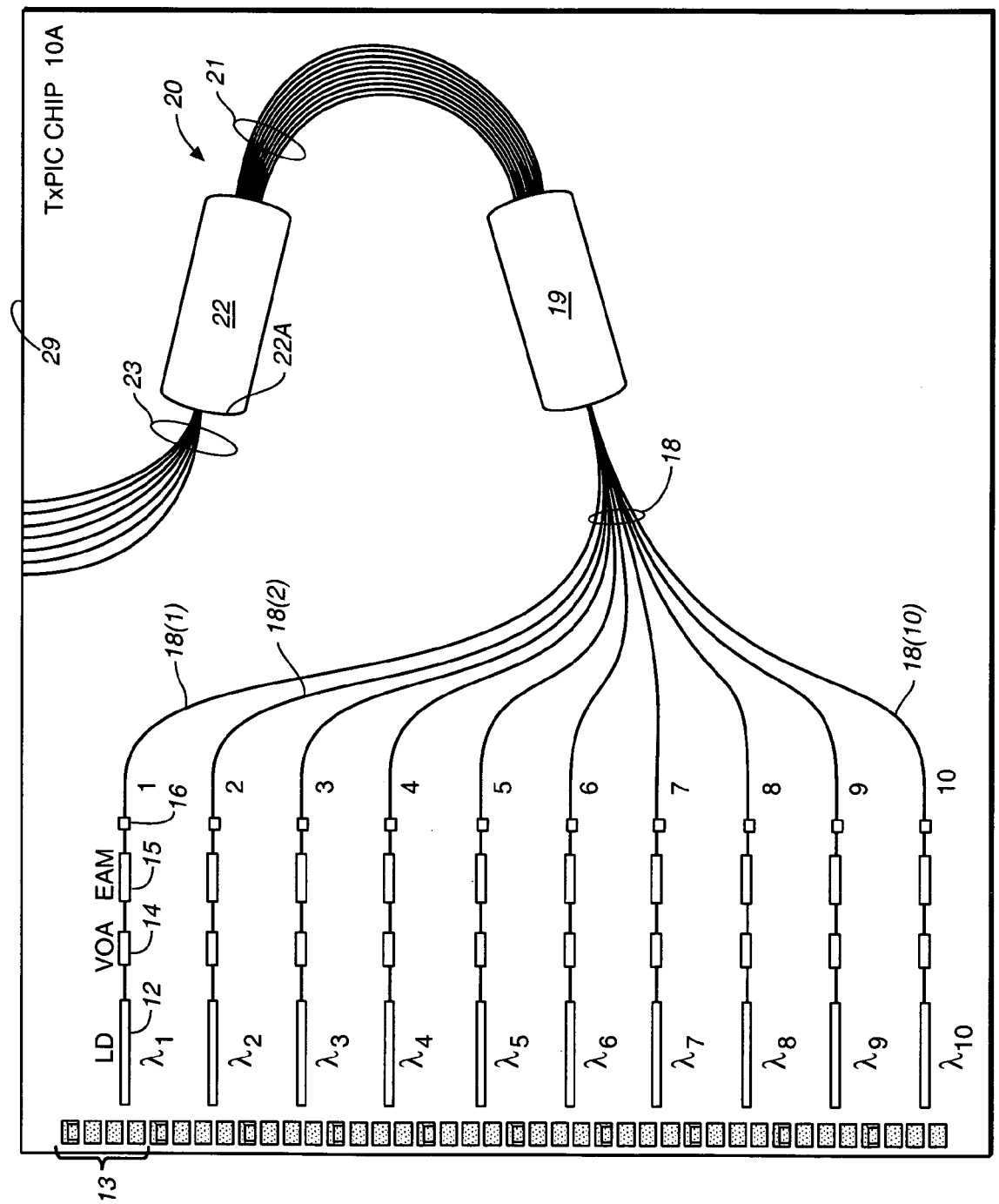
FIG._2

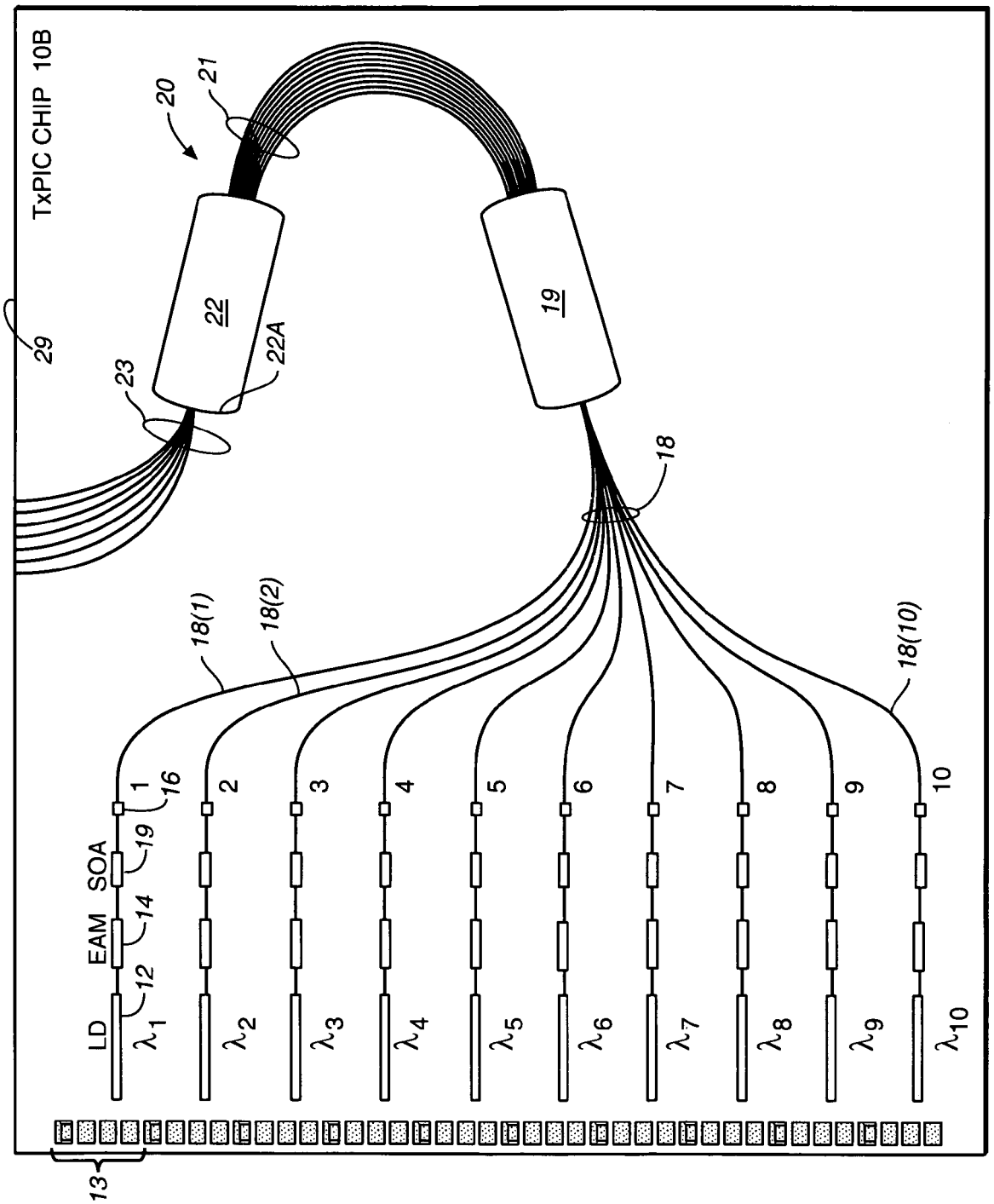
FIG._3

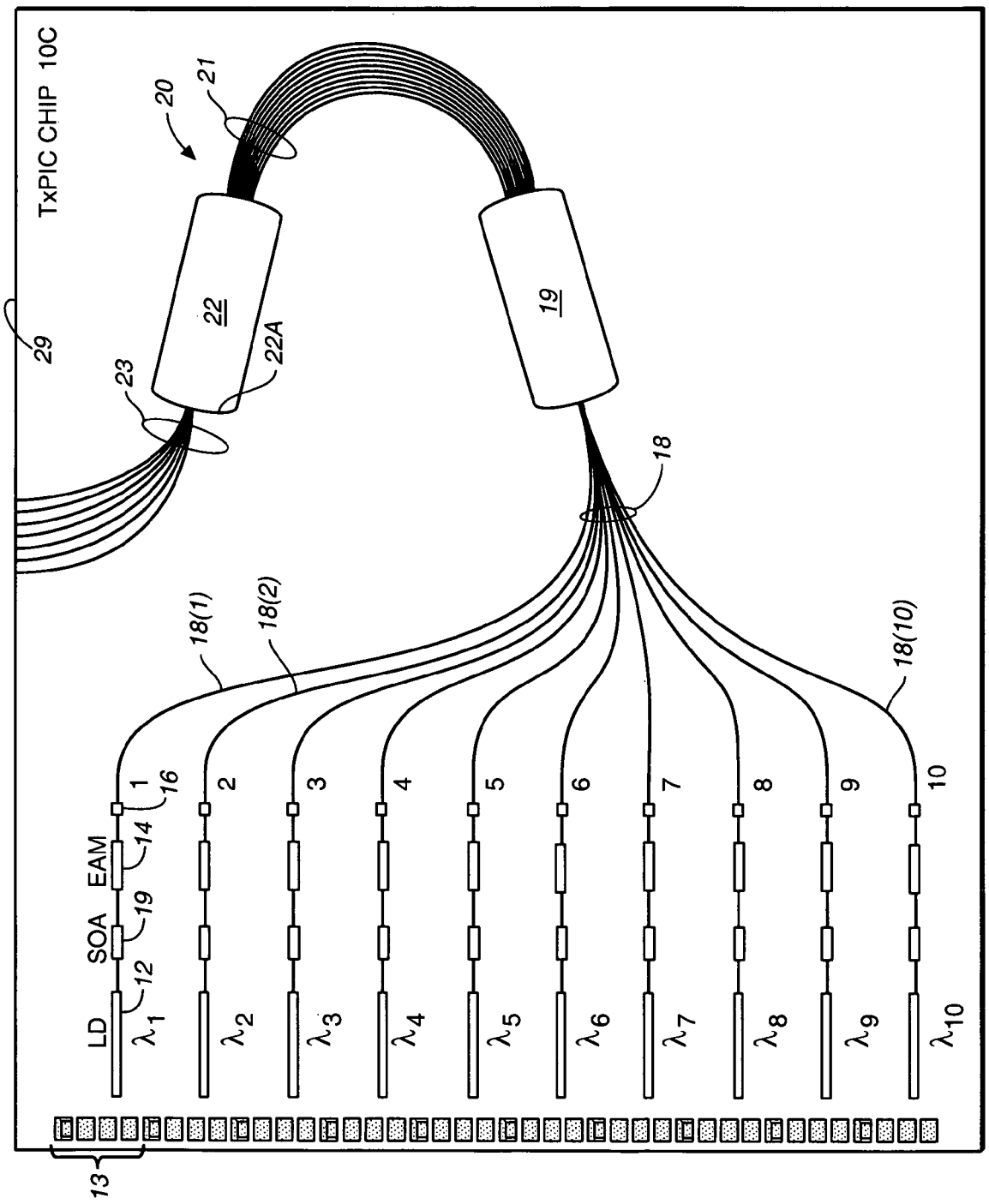
FIG._4

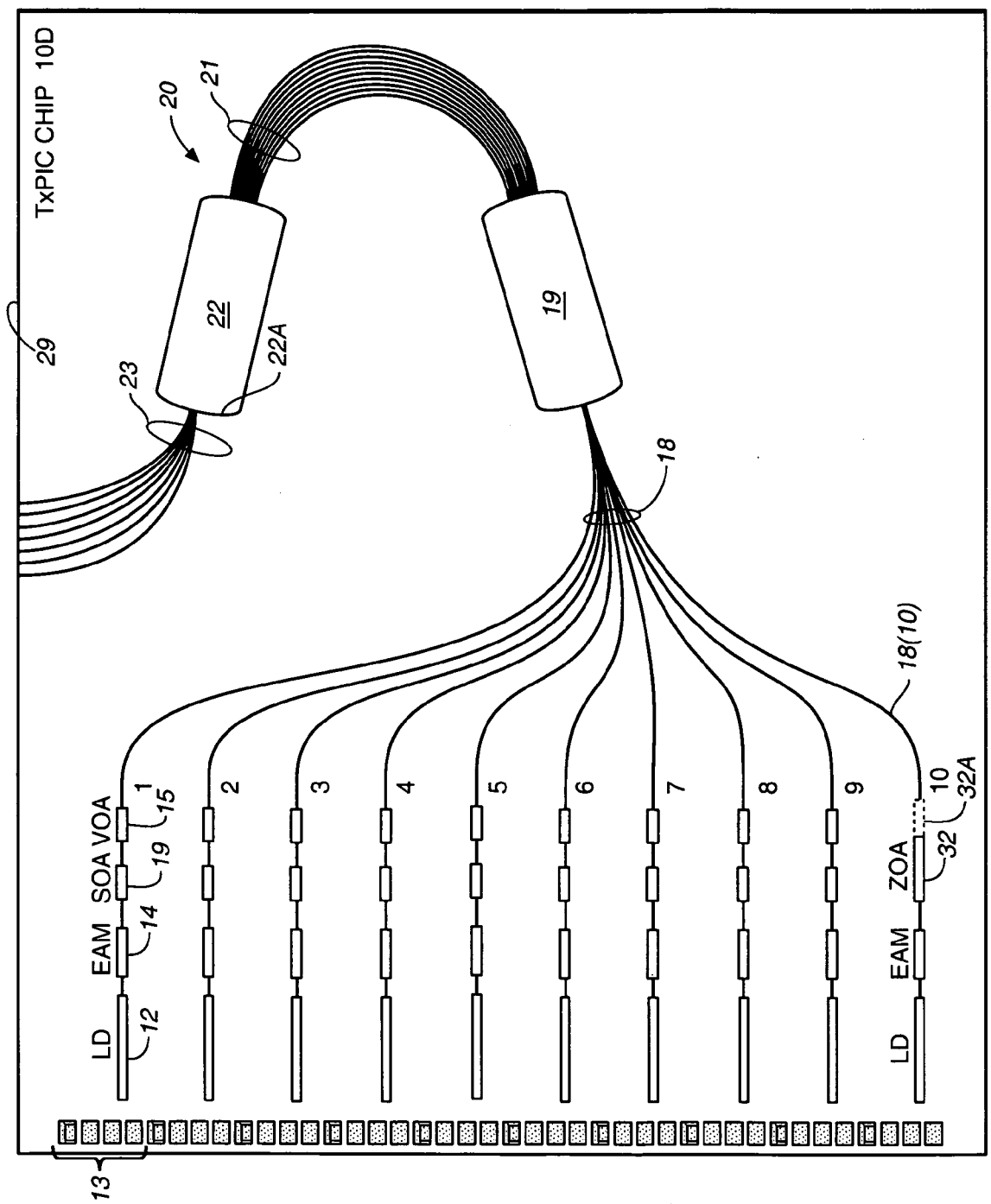
FIG._5

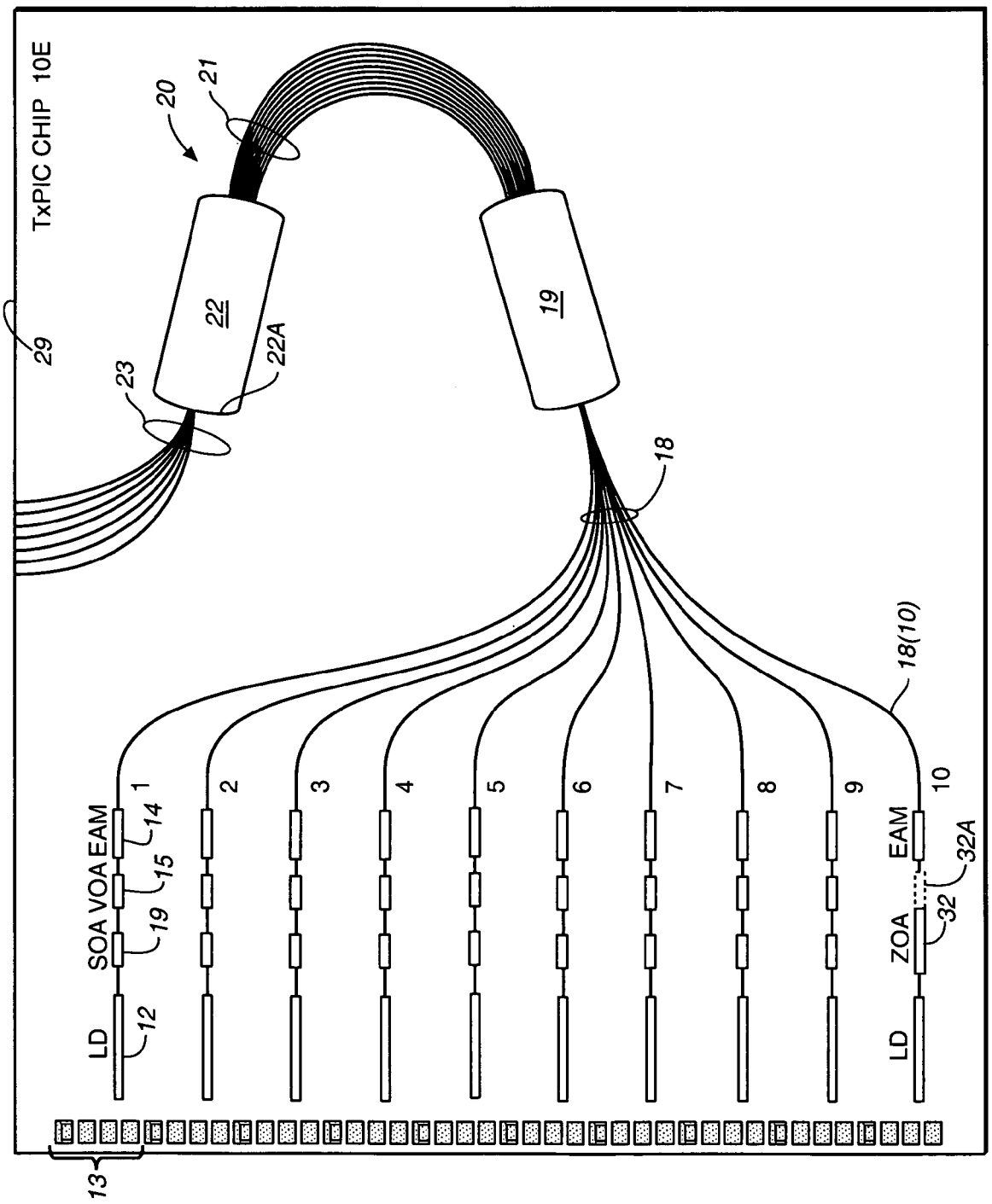

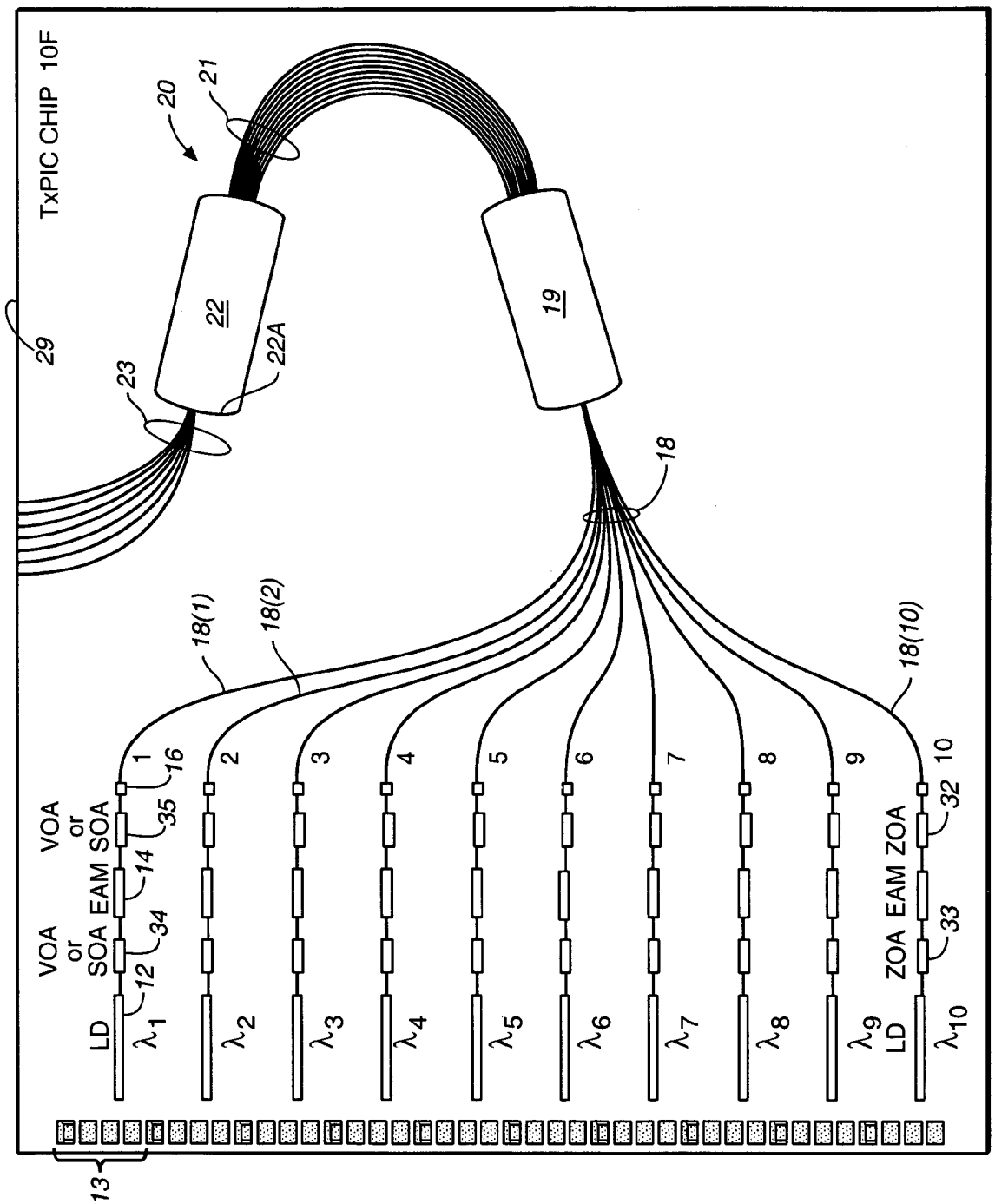
FIG._7

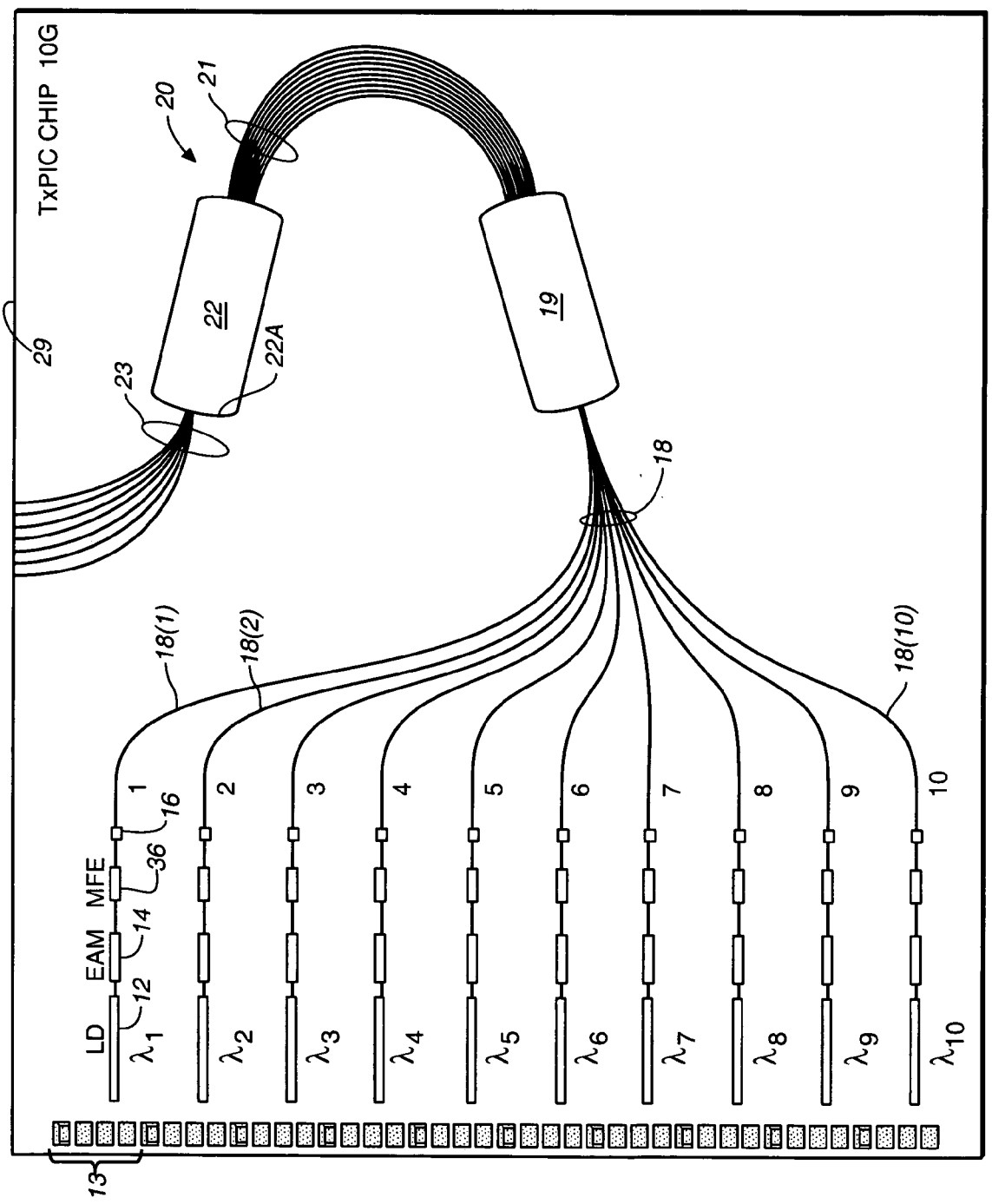
FIG._8

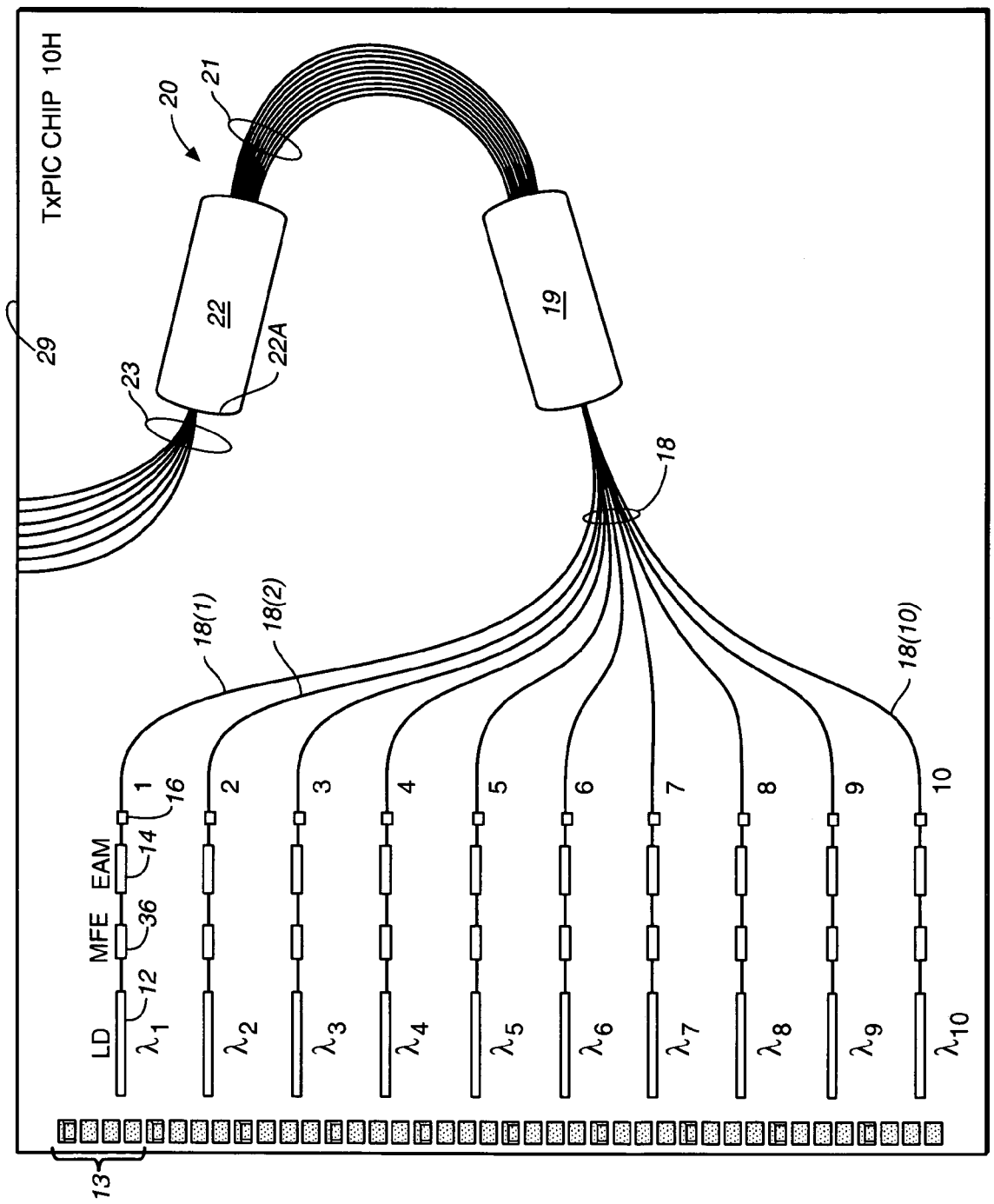
FIG._9

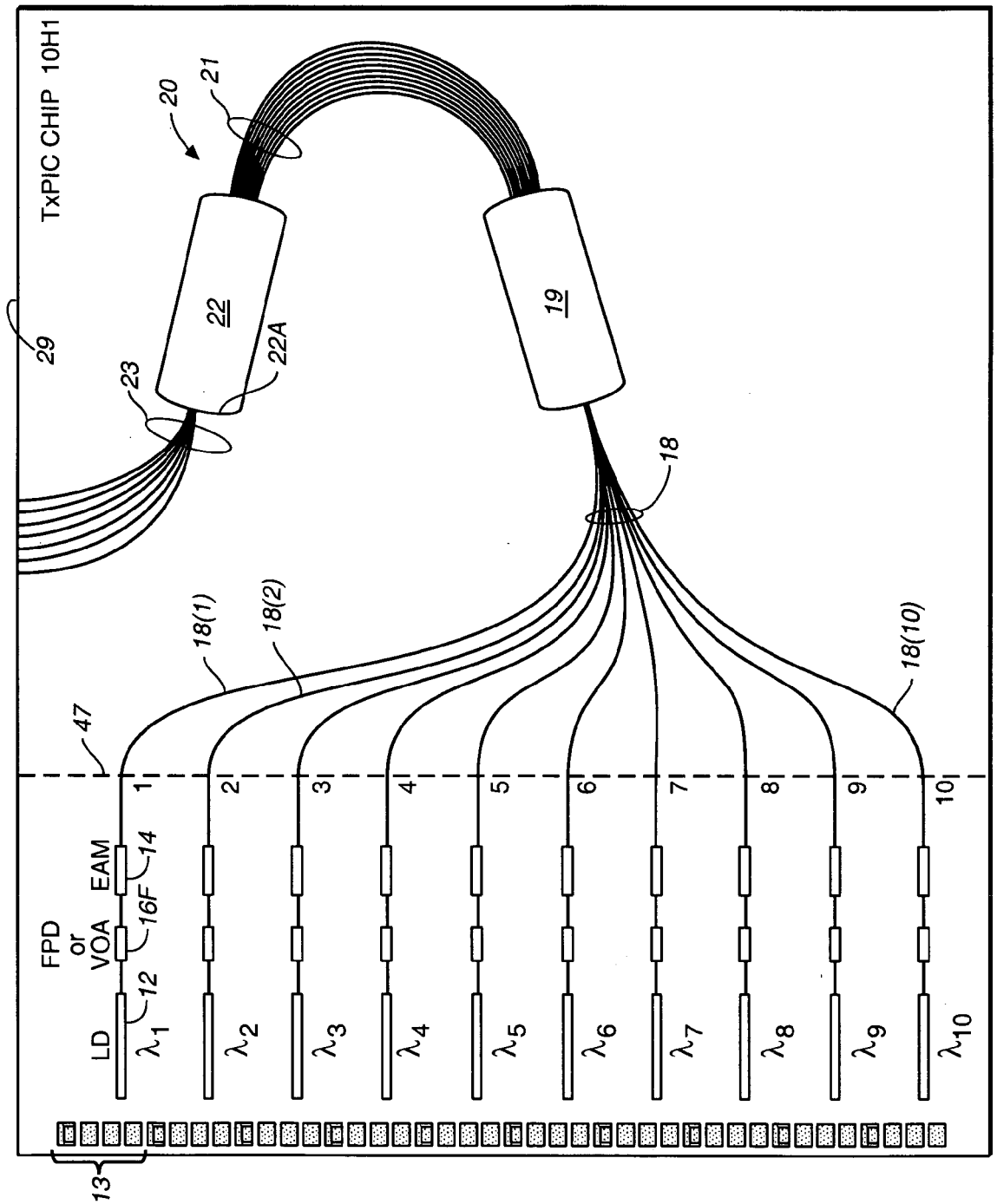
FIG._10

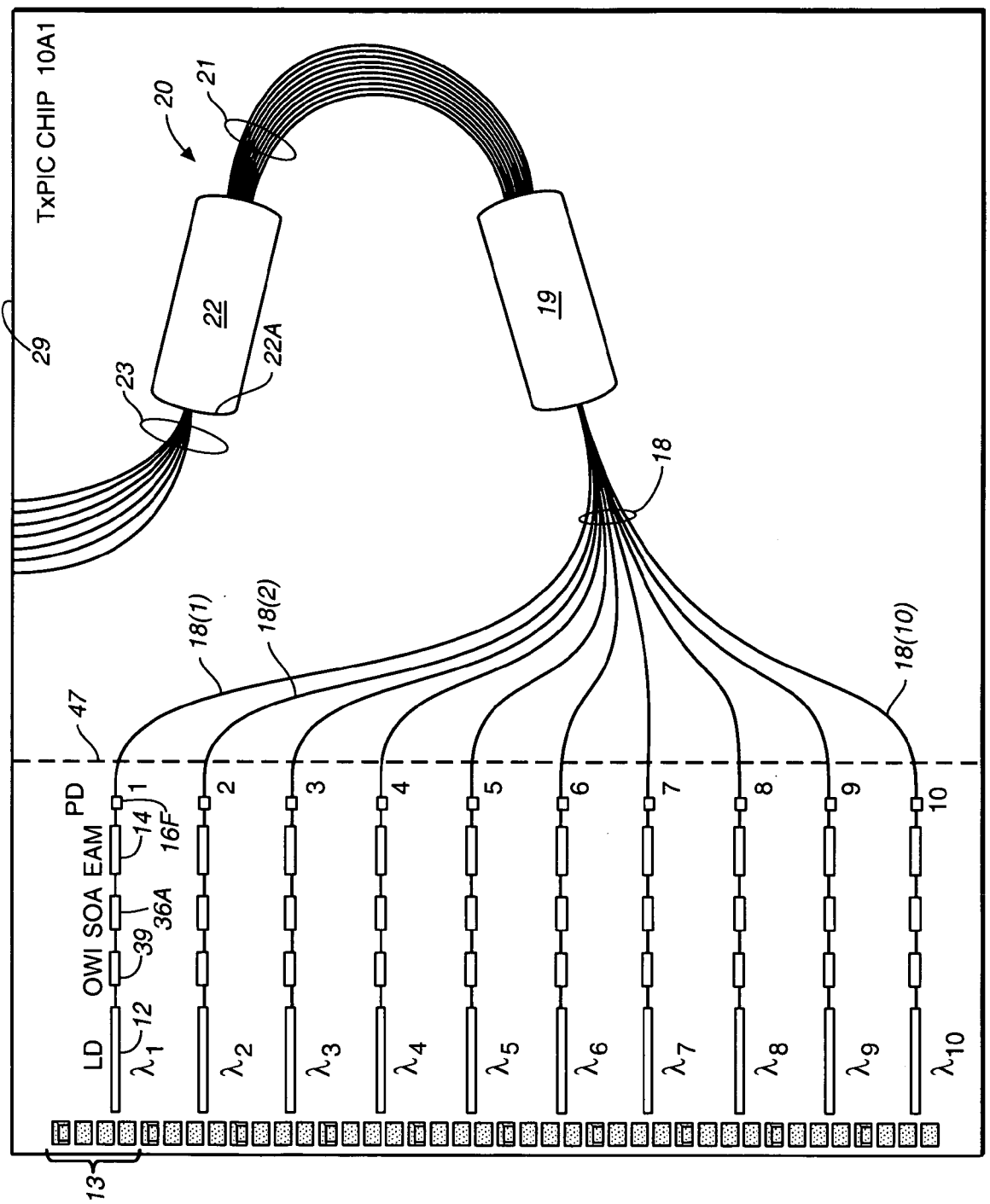
FIG._11

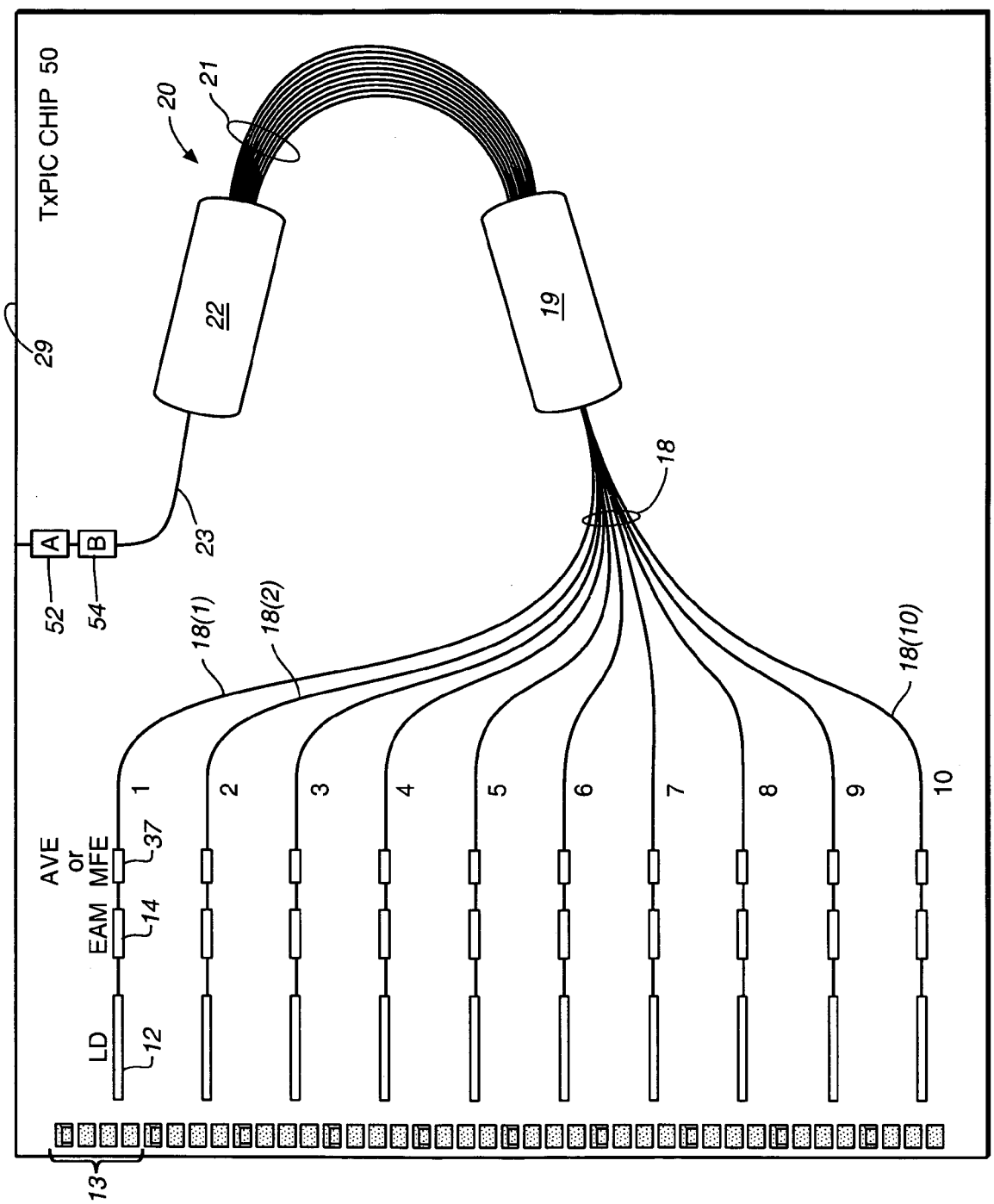
FIG._12

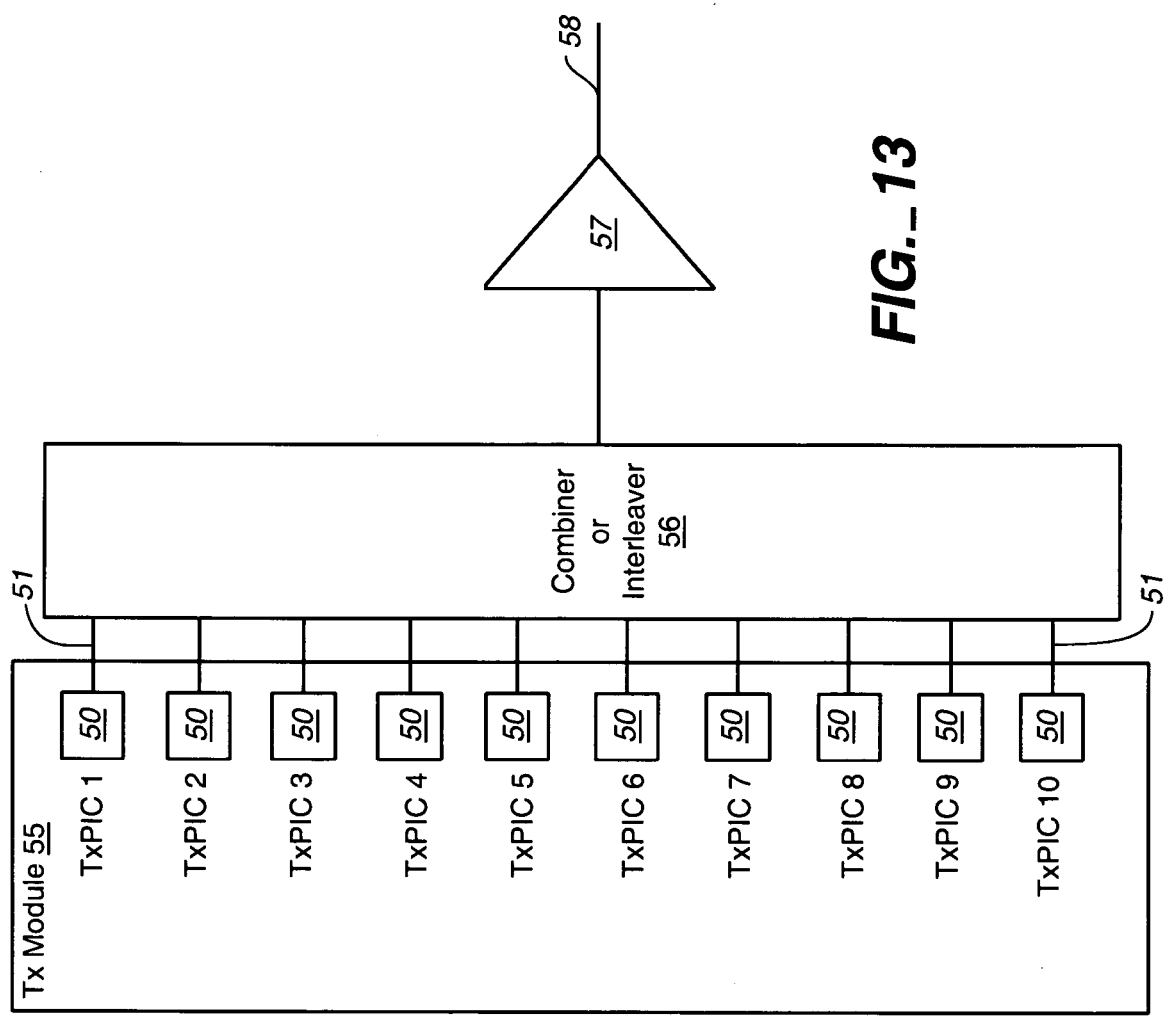
FIG._13

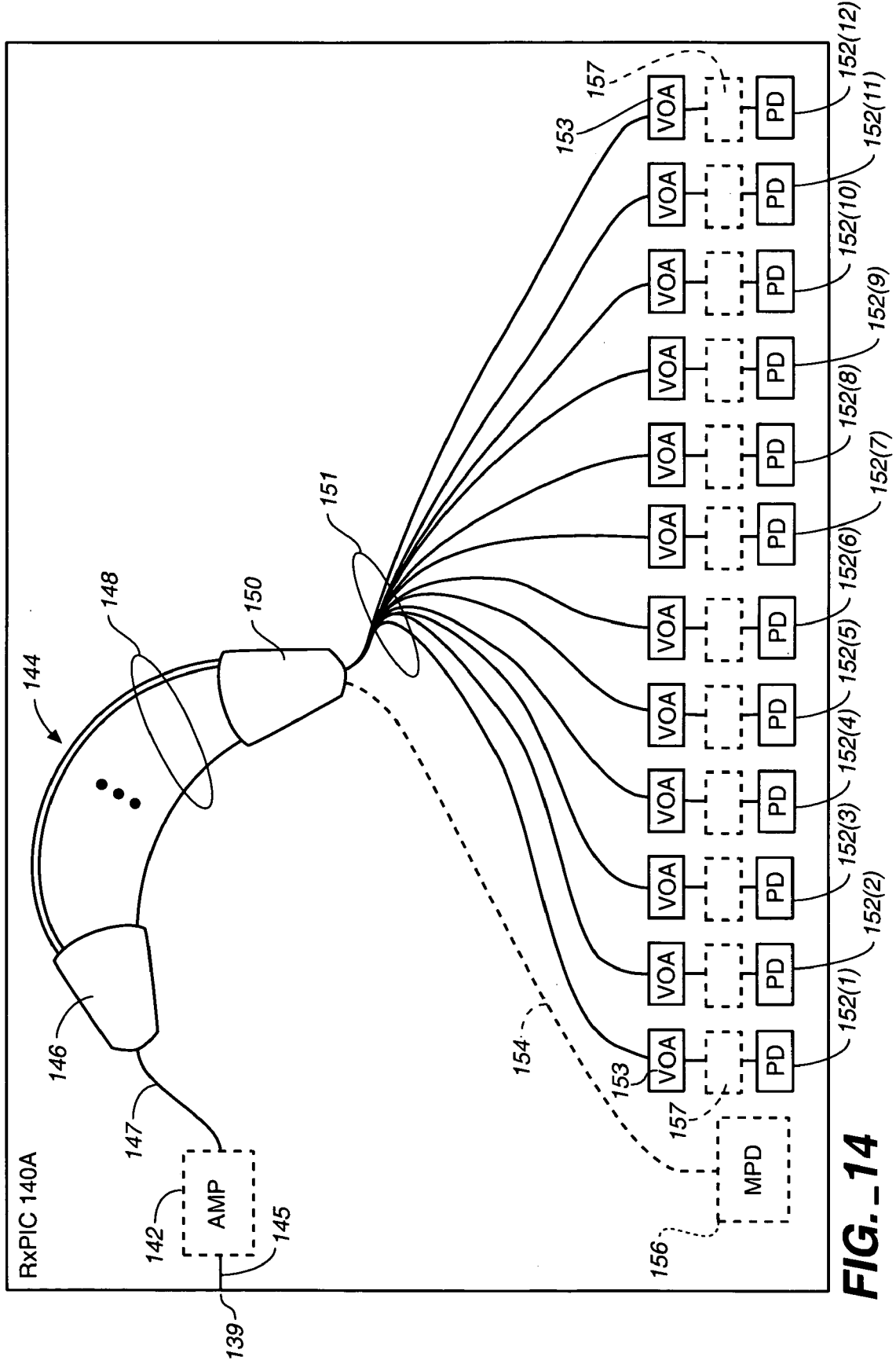
FIG._14

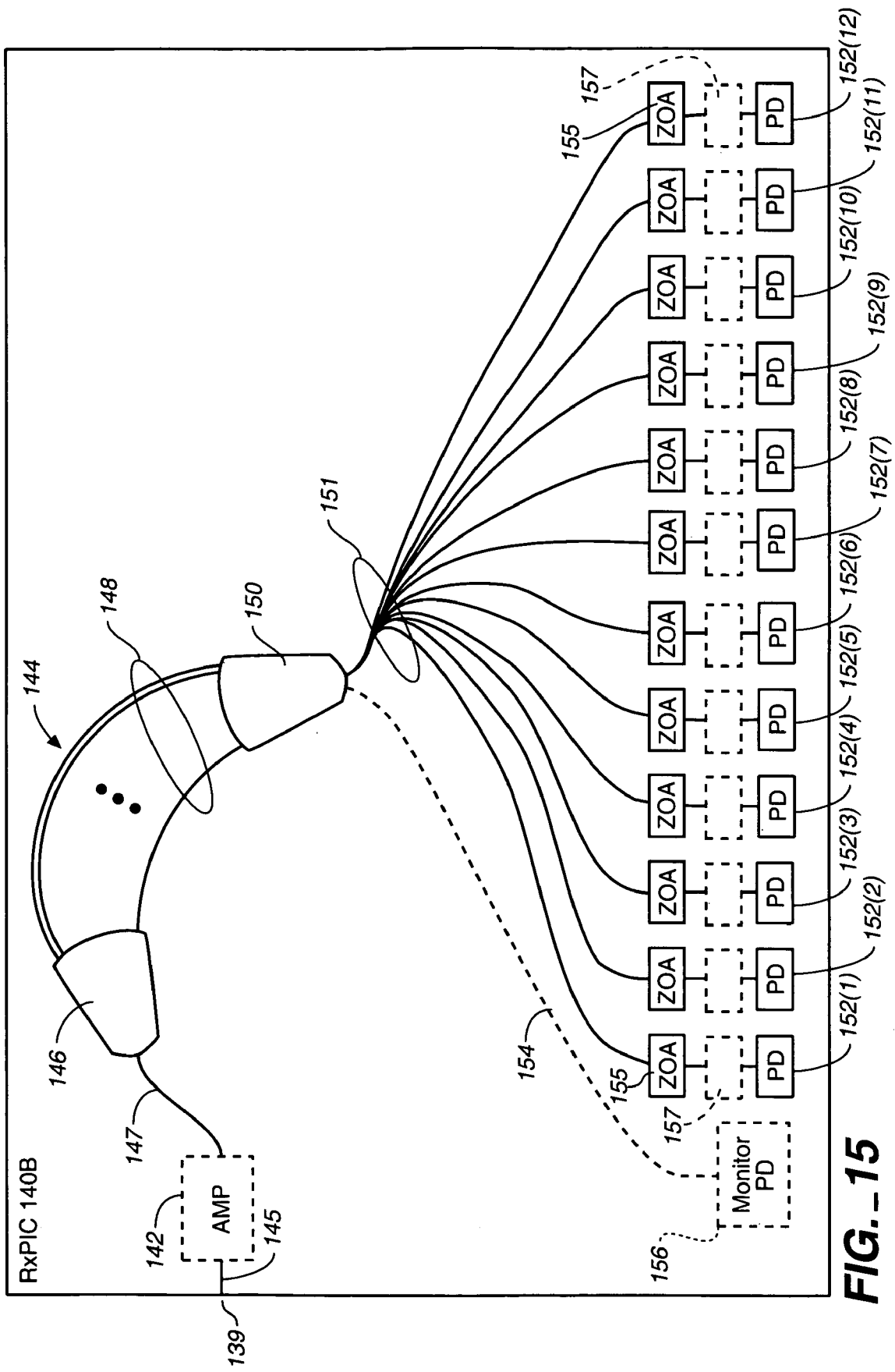
FIG._15

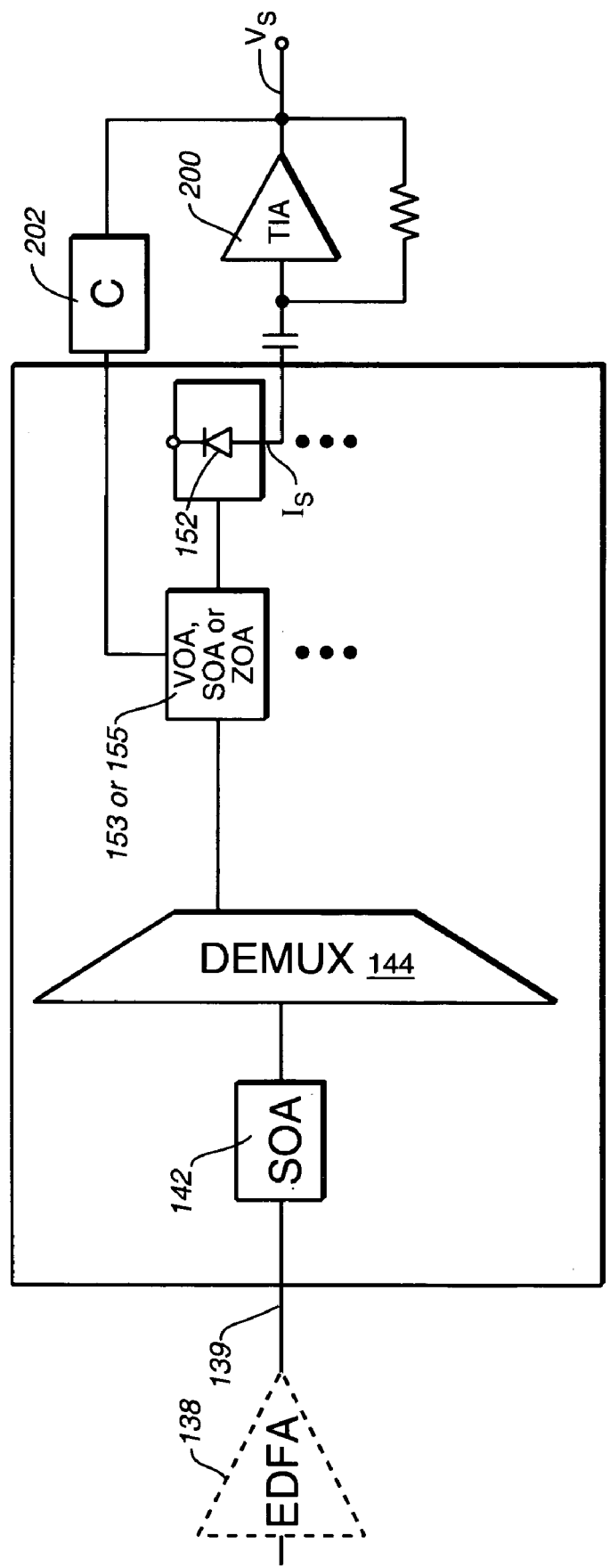
FIG._16

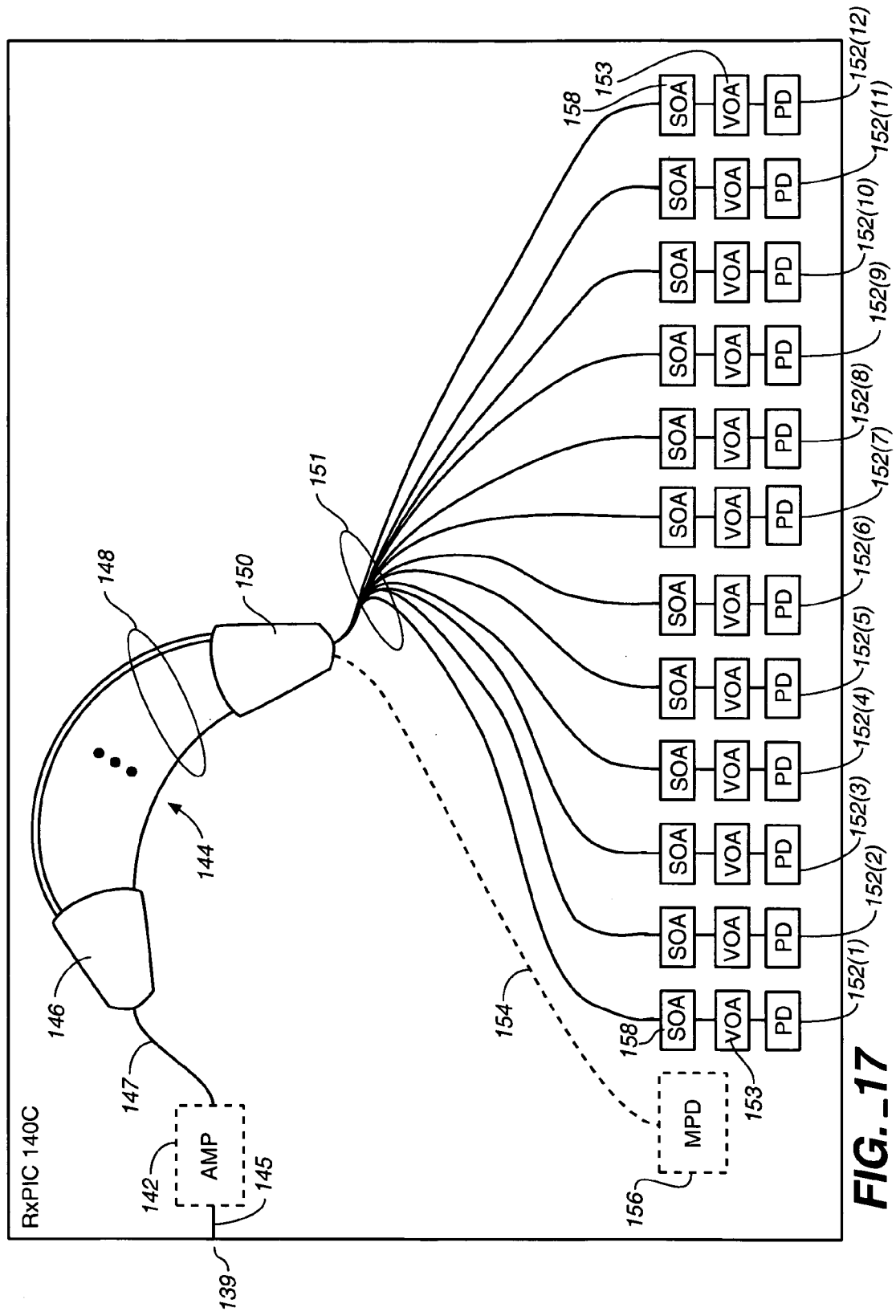
FIG._17

DEPLOYMENT OF ELECTRO-OPTIC AMPLITUDE VARYING ELEMENTS (AVES) AND ELECTRO-OPTIC MULTI-FUNCTIONAL ELEMENTS (MFES) IN PHOTONIC INTEGRATED CIRCUITS (PICS)

CROSS-REFERENCE TO RELATED APPLICATIONS

This application is a continuation-in-part of subject matter disclosed in and claims priority to U.S. patent application Ser. No. 10/267,331, filed Oct. 8, 2002 and entitled, TRANSMITTER PHOTONIC INTEGRATED CIRCUITS (TxPIC) AND OPTICAL TRANSPORT NETWORKS EMPLOYING TxPICs, also published on May 22, 2003 as Pub. No. US2003/0095737 A1; U.S. patent application Ser. No. 10/267,330, filed Oct. 8, 2002 now U.S. Pat. No. 7,079,715 and entitled, TRANSMITTER PHOTONIC INTEGRATED CIRCUIT (TxPIC) CHIP ARCHITECTURES AND DRIVING SYSTEMS AND WAVELENGTH STABILIZATION FOR TxPICs, also published on May 22, 2003 as Pub. No. U.S. 2003/0095736 A1; and U.S. patent application Ser. No. 10/267,304, filed Oct. 8, 2002 and entitled, AN OPTICAL SIGNAL RECEIVER PHOTONIC INTEGRATED CIRCUIT (RxPIC), AN ASSOCIATED OPTICAL SIGNAL TRANSMITTER PHOTONIC INTEGRATED CIRCUIT (TxPIC) AND AN OPTICAL TRANSPORT NETWORK UTILIZING THESE CIRCUITS, also published on Feb. 19, 2004 as Pub. No. US2004/0033004 A1, and, further, claims priority to provisional patent application Ser. No. 60/625,322, filed Nov. 5, 2004, all which applications are incorporated herein in their entirety by their reference.

BACKGROUND OF THE INVENTION

1. Field of the Invention

This invention relates generally to photonic integrated circuits (PICs) and more particularly to the deployment of various kinds of electro-optic amplitude varying elements (AVEs) and/or electro-optic multi-functional elements (MFEs) integrated in monolithic photonic integrated circuits (PICs).

2. Description of the Related Art

This disclosure relates to photonic integrated circuits or PICs and the active and passive elements that may be integrated in such circuits, in particular, elements that are in addition to the primary functional elements comprising the circuits. For example, in the above incorporated patent applications, there are disclosed transmitter photonic integrated circuits or TxPICs and receiver photonic integrated circuits or RxPICs employed in optical communication systems or networks. The TxPICs minimally include, in monolithic form, a plurality of signal channels that each includes a modulated source having a unique emission wavelength or frequency, with their outputs coupled to an optical combiner that combines modulated source signal outputs into a single WDM signal for output from the chip. The RxPICs minimally include, in monolithic form, an input to an optical decombiner with multiple outputs each coupled to a photodetector. This disclosure fundamentally relates to the addition of active elements to these circuits and these additional elements are collectively referred to as electro-optic amplitude varying elements (AVEs) and/or electro-optic multi-functional elements (MFEs) to perform various other functions in the operation of the circuits.

An optical transmission network or an optical transport system is limited in performance due to several issues. The primary issues are optical signal-to-noise ratio (OSNR) at both the optical transmitter and receiver, the Q at both the optical transmitter and receiver, and the dynamic range of the optical receiver, i.e., the level of ability to receive distorted channel optical signals and still interpret the data represented by the information modulated on the channel signals sent from the optical transmitter. This level of dynamic range at the optical receiver is a composite of many factors, such as, for example, the gain flatness of an optical amplifier just prior to the input of the optical receiver, which amplifier is usually a EDFA, the sensitivity variation in the optical transmitter and receiver, launch power variations in the optical transmitter, wavelength dependent losses and insertion losses in the optical transport system. The accumulative effect of the foregoing is to limit the overall reach of the optical transmission system or, alternatively, to increase the cost of the system. The optical receiver dynamic range is ultimately dictated by the noise and saturation effects of the signal channel photodetectors, which receive a demultiplexed optical channel signal for conversion into an electrical signal, and the noise and saturation effect of the transimpedance amplifier (TIA) coupled to receive the photocurrent channel signal. This noise and saturation effect can be quite large such as 5 dB to 15 dB, for example.

An important part of current day wavelength division multiplexing (WDM) transmission systems is the monitoring of system parameters that are indicative of impairments in the system such a per channel signal power, per channel wavelength stabilization, channel power level across an array of signal channels with an eye toward power equalization as well as gain tilt across the channel gain spectrum with gain tilt being significantly imposed on the channel signals by optical fiber amplifiers, such as EDFAs.

Also, in a WDM communication system, since each modulated signal channel is allocated a different wavelength that together approximate a standardized wavelength grid, the different wavelengths experience different delay effects in propagation in the optical medium or fiber as well as nonlinear effects of stimulated Raman scattering in the fiber so that when the channel signals are received on the optical receiver side of the system, the modulated channel signals have experienced chromatic dispersion due to both the characteristics of the fiber medium and also the gain characteristics and gain slope of a mid-span optical fiber amplifier. Thus, it is desired that optical power levels of the channel signals be equalized as they emerge from the transmitter. Even if the transmitted channel signals are equalized, they arrive at the receiver distorted with variations among the optical signal levels resulting in an unacceptable level of transmission errors. The transmission characteristic brought about by the foregoing effects is measured by the optical signal-to-noise ratio or OSNR as viewed at the optical receiver. The OSNR is improved by the deployment of pre-emphasis technology by adjusting, on the transmission side, the amplitude profile of the channel signals across the channel wavelength spectrum where such adjustment takes into account the dispersion characteristics of the fiber medium and/or the gain characteristics of link optical fiber amplifiers. The gain characteristics of an EDFA are typically strongest in the center of its gain spectrum so that in the pre-emphasized state, the pre-emphasis performed on the transmitter side would be an opposite gain spectrum across the channel signal array where the center channel would have the lowest power and extending to either side of the center the gain profile across those channels would monotonically increase so that the outside channels of the array will end up with the most initially applied gain.

In order to either equalize the channel or transmission signals, attenuators or amplifiers in combination with attenuators are deployed. It is known in the art to utilized variable optical attenuators (VOAs) by themselves or in combination with semiconductor optical amplifiers (SOAs) particularly for the purposes of providing signal equalization across an array of signals. A good example of the state of the art is disclosed in U.S. Pat. No. 6,271,945 where discrete devices are employed for discrete trains of electro-optic elements or components for each signal channel as seen in FIGS. 9 and 10, for example, of this patent. The elements comprise a discrete array of laser sources operating at different channel wavelengths and each coupled to an external modulator which is coupled, via a coupler to a corresponding attenuator in one embodiment (FIG. 9) or to a correspond amplifier (FIG. 12) in another embodiment. After multiplexing of the signal channels, a portion of the signal is tapped off to a spectrum analyzer to determine the power level of each channel signal. If any adjustment is necessary to equalize the channel signals relative to one another, a control circuit is employed to adjust the attenuation or gain level of a respective signal channel via its attenuator or amplifier to bring the channels back into equalization. In U.S. Pat. No. 6,282,361, an integrated multi-channel optical attenuator comprising an array of attenuators, e.g., a Mach-Zehnder interferometer (MZI), is disclosed where the channel signals provided as an input to the attenuator are equalized across a channel array via a per channel attenuator.

While the interest in this application is the deployment of such optical gain equalizing elements or components in monolithic photonic integrated circuits or PICs, this is not to say that there have not been suggestions of such in the art. For example, in FIG. 13 of U.S. Patent Application Pub. No. US2002/0109908A1, published Aug. 15, 2002, a monolithic device that includes a double pass multiplexer/demultiplexer that has a common input/output is illustrated in combination with a SOA and a VOA in each signal channel which, respectively, increase and decrease signal intensity so that the overall intensity level of all signals across the channel signal array are substantially uniform. The SOA in each channel increases the gain in the channel by increasing the bias on the amplifier which induces population inversion to bring about optical gain to a channel signal traversing the amplifier. In a VOA, the application of an applied negative or reverse junction bias brings about optical absorption and the amount of absorption of a channel signal traversing the attenuator is determined by the amount of reverse bias that is applied to the device in conjunction with, of course, the absorption length of the device. As indicated in this publication relative to one mode of operation, the frequency response of the VOAs is higher compared to that of SOAs so that the channel signals can be first amplified to higher values greater than the required minimum so that the rapid response of the several VOAs can be utilized to quickly achieve equalization across the array of channel signals. The publication, WO02/098026A1, published Dec. 5, 2002, shows a similar double pass device multiplexer/demultiplexer but without the deployment of SOAs.

Another aspect in the utilization of PICs is the optimum placement of integrated amplitude varying elements (AVEs) in the signal channels of an array of modulated sources, such as an integrated modulated laser in each channel on the PIC or an integrated laser source and external electro-optic modulator in each channel on the PIC. AVEs such as SOAs, VOAs, ZOAs (combination SOA/VOAs) or monitoring photodetectors (PDs) functioning also as a reverse bias AVEs or like VOAs when placed in different locations in PIC signal channel paths can have detrimental affects on the channel modulated signal. As an example, in the case where the array of laser sources, whether DFB lasers or DBR lasers, form a plurality of signal channels in a transmitter photonic integrated circuit (TxPIC), it may be desired to operate the laser sources at a constant bias current above their respective thresholds while providing a feedback system to stabilize their wavelength operations over life such as disclosed in Pub. No. US2003/0095736 A1, supra. In order to accomplish constant output from the constant bias current laser sources over life, it is necessary to control their power output across the channel array to be substantially uniform. In order to accomplish this task, some type of AVE can be included in each signal channel path so that the output power of modulated signals from each channel to the on-chip optical combiner are all substantially at the same power level. However, the added channel AVEs may have some affect one the optical modulated signal shape and the signal optical spectrum so that it becomes important as to where such AVEs may be placed in the signal channel paths to achieve optimum performance in terms of modulated signal output substantially unaffected by AVE operation.

OBJECTS OF THE INVENTION

Therefore, it is an object of the present invention to overcome the aforementioned problems.

It is an object of this invention to enhance the dynamic range of an optical communication system by deployment of per channel integrated amplitude varying elements (AVEs) and/or multi-functional elements (MFEs) in a photonic integrated circuit (PIC), including but not limited to, a transmitter photonic integrated circuit (TxPIC) or in a receiver photonic integrated circuit (RxPIC).

It is a further object of this invention to improve the dynamic range of gain/loss adjustment across a plurality of channel signals produced in an optical transmitter photonic integrated circuit (TxPIC) by employing one or more of an AVE, such as, for example, an integrated VOA, photodetector (PD), SOA, combination SOA/VOA, ZOA, or a MFE in each channel path comprising a train of active, or active and passive, elements.

It is also a further object of this invention to improve the dynamic gain/loss in multiple signal channels of an optical receiver photonic integrated circuit (RxPIC) by deploying a VOA a ZOA or a MFE in each signal channel path, such as, in an optical waveguide between an associated channel photodetector (PD) and an on-chip decombiner or demultiplexer.

It is also a further object of this invention to place an AVE in each signal channel path of a TxPIC to improve the functionality and performance of modulated sources in the TxPIC signal channels.

SUMMARY OF THE INVENTION

According to one feature of this invention, a monolithic photonic integrated circuit (PIC) comprises an integrated array of primary level electro-optic elements formed as a plurality of signal channels in the circuit and including in those signal channels at least one additional electro-optic element comprising an electro-optic amplitude varying element (AVE) and/or a electro-optic multi-functional element (MFE).

Another feature of this invention is a monolithic photonic integrated circuit (PIC) comprises an integrated array of electro-optic elements formed as a plurality of signal channels in the circuit, with each signal channel including at least a laser source, an electro-optic modulator and an electro-optic amplitude varying element (AVE). Variation of a bias current to the respective electro-optic amplitude varying elements (AVEs) results in substantial uniform power across the array of channel signals. The electro-optic amplitude varying elements (AVEs) may be a variable optical attenuator (VOA), a semiconductor optical amplifier (SOA), an in-series variable optical attenuator (VOA) and a semiconductor optical amplifier (SOA), or a combination variable optical attenuator/semiconductor optical amplifier, as referred to herein as a "ZOA", as will be explained later in more detail. Also, more than one AVE may be provided in each signal channel of the circuit one before the electro-optic modulator and/or one after the electro-optic modulator in each signal channel.

Another feature of this invention is a monolithic photonic integrated circuit (PIC) that comprises an integrated array of electro-optic elements formed as a plurality of signal channels in the circuit, each signal channel including at least a laser sources for producing continuous wave light, an electro-optic modulator to modulate the light to produce a modulated optical signal and a multi-function element (MFE) which performs at least two separate electrical or electro-optic functions relative to the modulated optical signal in each signal channel through interaction with the optical signal propagating through the multi-function element (MFE). In general, the MFE in a PIC channel may perform the dual function selected, for example, from the group of controlling the light in some manner (e.g. amplification or attenuation), modulating the light in some manner such as with a tone frequency, and monitoring the power of the light. Such a dual function may be performed by a variable optical attenuator (VOA) or a photodetector (PD); a variable optical attenuator (VOA) or a semiconductor optical amplifier (SOA); a combination variable optical attenuator (VOA) and a semiconductor optical amplifier (SOA), which is also referred to as a ZOA; or a ZOA or a photodetector (PD). The multi-function element (MFE) may be at an output of the electro-optic modulator in each of the signal channel paths on the PIC chip or between the laser sources and the electro-optic modulator in each of the signal channel paths on the PIC chip or at both such locations.

Another feature of this invention is a monolithic photonic integrated circuit (PIC) that comprises an integrated array of electro-optic elements formed as a plurality of signal channels in the circuit, each signal channel including at least a laser source and an electro-optic modulator to provide a respective modulated optical signal, an optical combiner coupled to receive the modulated optical signals from the signal channels and combine them into a single WDM signal, or what may be referred to as an optical signal group (OSG), and also, optionally, at least one electro-optic amplitude varying element (AVE) between the optical combiner and an output for the circuit. The electro-optic amplitude varying element (AVE) may be an in-series or in-tandem semiconductor optical amplifier (SOA) and variable optical attenuator (VOA) or a Mach-Zehnder interferometer (MZI); a combination variable optical attenuator (VOA) and a semiconductor optical amplifier (SOA), also referred to as a ZOA; an in-series or in-tandem multi-function element (MFE) and an variable optical attenuator (VOA) or a semiconductor optical amplifier (SOA) or ZOA; an in-series or in-tandem first and second semiconductor optical amplifiers (SOAs); an in-series or in-tandem first and second variable optical attenuator (VOAs); or an in-series or in-tandem first and second ZOA. In cases where a semiconductor optical amplifier (SOA) is employed, a gain-clamped SOA-(GC-SOA) may alternatively be considered in place of an SOA. A further electro-optic amplitude varying element (AVE) may be provided in each signal channel either between the laser source and the electro-optic modulator in each of the signal channels or at an output of the electro-optic modulator in each of the signal channels or in both locations to compensate for gain tilt that may be experienced by a WDM signal at the circuit output as provided to an off0chip optical amplifier, such as, fro example, an EDFA.

Another feature of this invention is a monolithic photonic integrated circuit (PIC) that comprises an circuit input for receiving a WDM signal from an optical link, an optical decombiner for decombining the WDM signal into a plurality of separate channel signals each on a respective optical output waveguide or channel from the optical combiner, an array of photodetectors (PDs) each coupled to a respective channel signal from the optical decombiner and an electro-optic amplitude varying element (AVE) in each signal channel or waveguide between the optical decombiner and a respective photodetector. The electro-optic amplitude varying element (AVE) may be a variable optical attenuator (VOA), a semiconductor optical amplifier (SOA), an in-series or in-tandem variable optical attenuator (VOA) and a semiconductor optical amplifier (SOA), or a combination variable optical attenuator (VOA) and a semiconductor optical amplifier (SOA), also referred to as a ZOA.

The VOAs may be designed as either electro-absorption VOAs or bandedge VOAs. The same is true for the designs of the PDs.

The above-mentioned optical decombiner may be a arrayed waveguide grating (AWG), an Echelle grating, a cascaded Mach-Zehnder interferometer, quasi-selective wavelength star coupler, a power coupler, a star coupler, or a multi-mode interference (MMI) coupler.

More particularly, according to this invention, an array of variable optical attenuators (VOAs) are provided in an optical transmitter photonic integrated circuit (TxPIC) where each VOA is respectively inserted in each signal channel path comprising a train of electro-optic elements between an electro-optic modulator and an input to an WDM multiplexer or combiner to attenuate the modulated channel signals so that they are substantially equal in power with other modulated channel signals that are all provided as signal inputs to the optical multiplexer or combiner.

More particularly, according to this invention, an array of variable optical attenuators (VOAs) are provided in an optical receiver photonic integrated circuit (RxPIC) where each VOA is respectively inserted in a signal channel or waveguide between a WDM signal demultiplexer or decombiner and a corresponding channel photodetector. The VOA employs per channel information from a corresponding transimpedance amplifier (TIA) coupled to the output of each photodetector, for example, to set the bias value of the VOA to insure that each channel signal remains within the dynamic range of the optical receiver and does not saturate either the photodetector or the TIA. As a result, the optical transmission network connected to the optical receiver can afford far greater dynamic range variations when the on-chip VOA attenuation is employed thereby extending the signal reach by improving the OSNR and/or reducing the amount of control, necessary specifications, and costs of the optical transmission system in the optical receiver. The VOA is operated with a reverse bias applied to optimize the dynamic range for each channel signal. The attenuation reduces the noise floor rendering the TIA to be more definitively define the sinusoidal or square voltage output from the photodetectors representative of binary values of "1" and "0" in the optically converted electrical signal. The VOA may be an electro-absorption type of VOA or may be a Mach-Zehnder phase type of VOA. A bandedge VOA functions like a reverse bias PIN photodiode which operates in the region of its bandedge. The VOA may also have a shifted bandgap in its active region so that the amount of signal loss accomplished by a given applied negative voltage will be enhanced. Further, the VOA may be a combination semiconductor optical amplifier/variable optical attenuator (SOA/VOA), also referred to, herein, as a ZOA, where a ZOA is a single electro-optic component designed to operate either as an optical amplifier (SOA) or an optical attenuator (VOA) depending upon the bias sign applied to the ZOA. A ZOA provides for even greater enhancement of the optical receiver dynamic range as well as sensitivity compared to either a VOA or SOA employed by itself.

More particularly, according to this invention, at least one electro-optic amplitude varying element (AVE) at the WDM optical signal output of a WDM multiplexer or combiner in a multi-channel optical transmitter photonic integrated circuit (TxPIC) chip in an optical transmission module having a plurality of such TxPIC chips where each on-chip output AVE controls the gain level of the WDM or optical signal group (OSG) signal in each chip output to provide for uniformity with other such OSG output signals from other TxPICs in the module where the WDM signal outputs are further optically combined or interleaved prior to transmission on an optical medium or fiber. Such chip output AVEs either amplify or attenuate the WDM signal output, such as might be accomplished with electro-optic element combinations of a variable optical attenuator (VOA), semiconductor optical amplifier (SOA), a gain-clamped semiconductor optical amplifier (GC-SOA), Mach-Zehnder interferometer (MZI) or a multi-mode interferometer (MMI) switch.

Another feature of this invention is the utilization of AVEs in the signal channels of a TxPIC to provide for signal output equalization across the signal channel array without unduly distorting the modulated signals provided to the on-chip optical combiner. For example, for improved wavelength stability over life, each laser source, such as a DFB laser or DBR laser, is operated at a constant bias current. Each signal channel on the TxPIC includes a front photodetector (FPD) for monitoring the output power of each PIC channel. Each channel may also include a back photodetector (BPD) to monitor the power output of the laser source itself. Also, the front photodetector (FPD) of each channel also controls the average power in each channel so the power output from all signal channels across the channel array are substantially the same. Further, the FPD may be modulated with a low frequency tone as taught in Pub. No. US2003/0095736 A1, supra. Average channel power is controlled by varying the reverse bias voltage applied to the front photodetector (FPD). Such FPDs and BPDs may be, for example, a PIN photodiode or an avalanche photodiode.

As the laser sources age, their output power changes which alters the incident optical power to the electro-optic modulator, such as to an electro-absorption modulator (EAM) or a Mach-Zehnder modulator (MZM), in each signal channel path on the TxPIC. The resulting changes in photocurrent in the electro-optic modulator can shift the bias point of the electro-optic modulator, thereby altering chirp, extinction ratio and waveform distortion with respect to conditions set optimally at the beginning of life for the on-chip modulators. Modulated light output from the electro-optic modulator passes through the FPD before on-chip multiplexing occurs. When the FPD reverse bias is varied to control the individual channel power, for example, to compensate for changing laser source output power, the waveform created by the electro-optic modulator can be altered by a charge transport phenomena occurring at the FPD. This can affect the fidelity of the transmitted waveform thereby introducing changes in the bit error rate (BER) at an optical receiver as the FPD bias changes relative to conditions set optimally at the beginning of life for the respective modulators.

To avoid the foregoing problems, the following sequence of functional AVEs in each signal channel of the TxPIC is prescribed where, following the laser source, the next AVE is the FPD, followed by the electro-optic modulator. With this sequence of integrated elements in each signal channel, particularly in the case where the laser sources are driven at constant bias current for improved wavelength stability, changes of laser source output power can be compensated for by changing the FPD insertion loss, resulting in approximately constant channel output power across the signal channel array as well as approximately constant input power to the respective electro-optic modulator over life. In this manner, the conditions that optimize transmission performance at beginning of life remain approximately unchanged over the life of the TxPIC. Additionally, the modulated light output from the electro-optic modulator only propagates through passive optical elements in the TxPIC architecture, e.g., the optical combiner, thereby avoiding possible waveform degradation associated with charge transport phenomena occurring in a downstream AVE channel element, such as a photodetector, i.e., downstream of the electro-optic modulator. Thus, through this architecture, channel power control is made more independent from interaction with waveform generation (digital or analog modulation) for data transport.

Also, any back reflection from a butt joint formed during circuit fabrication existing along the channel path can be circumvented with improved optical isolation of the laser source. In some fabrication techniques utilizing MOCVD, for example, with selective area growth or SAG, a butt joint may be formed between the front photodetector (FPD) and the electro-optic modulator. There are other examples of such formed butt joints that may be formed in "stop and then regrow" techniques along the signal channels formed in a TxPIC, such as, for example, between the active channel elements and their inputs to the passive optical combiner. In any case, the insertion loss of the FPD provided at the laser source output can aid to isolate the laser source from such back reflections from such butt joints as well as from the affects of modulated back reflections passing through a signal channel electro-optic modulator from a downstream butt joint.

On the other hand, SOAs, rather than VOAs or photodetectors functioning as a VOA, may be employed for power equalization across the channel array. In this case, however, back reflections in the signal channels may be amplified rather than attenuated, as in the case of VOAs or FPDs, so that it may be preferred to include an integrated, optical waveguide isolator in each channel to protect the channel laser source from back reflections that may cause the laser source from becoming unstable, in particular, change its emission wavelength or its optical spectrum. Such optical waveguide isolators are known in the art particularly as discrete active or passive elements and find uses in optical communication systems. The purpose of an optical isolator is to eliminate unwanted or reflected optical signals from interfering with a desired optical function. For example, an optical waveguide isolator may be inserted in an optical signal path between a distributed feedback (DFB) laser and an optical fiber. Without the isolator, unwanted optical signals (i.e., reflections) from the optical fiber would couple back into the DEB laser and adversely affect its transmitted optical spectrum. By including an isolator in such situations, unwanted reflected signals are absorbed by the isolator and do not reach the laser source. Such optical isolators have not been proposed or used in conjunction with TxPICs.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts:

FIG. 1 is a plan view of a multi-signal channel, optical transmitter photonic integrated circuit (TxPIC) chip comprising a first embodiment of this invention utilizing a per channel AVE comprising VOA after the electro-optic modulator in each signal channel.

FIG. 1A is schematic diagram of a one of the signal channels in the TxPIC chip shown in FIG. 1.

FIG. 2 is a plan view of a multi-signal channel, optical transmitter photonic integrated circuit (TxPIC) chip comprising a second embodiment of this invention utilizing a per channel AVE comprising VOA before the electro-optic modulator in each signal channel.

FIG. 3 is a plan view of a multi-signal channel, optical transmitter photonic integrated circuit (TxPIC) chip comprising a third embodiment of this invention utilizing a per channel AVE comprising SOA after the electro-optic modulator in each signal channel.

FIG. 4 is a plan view of a multi-signal channel, optical transmitter photonic integrated circuit (TxPIC) chip comprising a fourth embodiment of this invention utilizing a per channel AVE comprising SOA before the electro-optic modulator in each signal channel.

FIG. 5 is a plan view of a multi-signal channel, optical transmitter photonic integrated circuit (TxPIC) chip comprising a fifth embodiment of this invention utilizing a per channel AVE comprising a combination of a SOA and VOA or a ZOA after the electro-optic modulator in each signal channel.

FIG. 6 is a plan view of a multi-signal channel, optical transmitter photonic integrated circuit (TxPIC) chip comprising a sixth embodiment of this invention utilizing a per channel AVE comprising combination of a SOA and VOA or a ZOA before the electro-optic modulator in each signal channel.

FIG. 7 is a plan view of a multi-signal channel, optical transmitter photonic integrated circuit (TxPIC) chip comprising a seventh embodiment of this invention utilizing a per channel AVE comprising combination of a SOA, VOA or ZOA before and after the electro-optic modulator in each signal channel.

FIG. 8 is a plan view of a multi-signal channel, optical transmitter photonic integrated circuit (TxPIC) chip comprising a eight embodiment of this invention utilizing a per channel multifunction element (MFE) after the electro-optic modulator in each signal channel.

FIG. 9 is a plan view of a multi-signal channel, optical transmitter photonic integrated circuit (TxPIC) chip comprising a ninth embodiment of this invention utilizing a per channel multifunction element (MFE) before the electro-optic modulator in each signal channel.

FIG. 10 is a plan view of a multi-signal channel, optical transmitter photonic integrated circuit (TxPIC) chip comprising a specific embodiment of the ninth embodiment of this invention utilizing a per channel multifunction element (MFE) or amplitude varying element (AVE), in particular a photodetector (PD) or VOA before the electro-optic modulator in each signal channel.

FIG. 11 is a plan view of a multi-signal channel, optical transmitter photonic integrated circuit (TxPIC) chip comprising a specific embodiment of the second embodiment of this invention utilizing a per channel amplitude varying element (AVE), in particular a SOA and optical isolator before the electro-optic modulator in each signal channel.

FIG. 12 is a plan view of a multi-signal channel, optical transmitter photonic integrated circuit (TxPIC) chip comprising a tenth embodiment of this invention utilizing one or more amplitude varying elements (AVEs) after the combiner or multiplexer in each signal channel.

FIG. 13 is a schematic diagram of a transmitter module having a plurality of TxPIC chips of a type shown in FIG. 10 with at least one output AVE where there WDM output signal or the optical signal group (OSG) signal from each chip are equalized with one another prior to being combined or interleaved for transmission on an optical link.

FIG. 14 is a plan view of a multi-signal channel, optical receiver photonic integrated circuit (RxPIC) chip comprising a eleventh embodiment of this invention utilizing a per channel AVE comprising a VOA after the decombiner but before the photodetector (PD) in each signal channel.

FIG. 15 is a plan view of a multi-signal channel, optical receiver photonic integrated circuit (RxPIC) chip comprising a twelfth embodiment of this invention utilizing a per channel AVE comprising a ZOA after the decombiner but before the photodetector (PD) in each signal channel.

FIG. 16 is a plan view of a multi-signal channel, optical receiver photonic integrated circuit (RxPIC) chip of the embodiment of either FIG. 11 or FIG. 12 of this invention having a feedback control circuit for varying the bias applied to a signal channel VOA, SOA or ZOA to enhance responsivity of the photodetectors without saturating them or the connected transimpedance amplifier (TIA).

FIG. 17 is a plan view of a multi-signal channel, optical receiver photonic integrated circuit (RxPIC) chip comprising a thirteenth embodiment of this invention utilizing a per channel AVE comprising a combination of a SOA and VOA after the decombiner but before the photodetector (PD) in each signal channel.

DETAILED DESCRIPTION OF THE INVENTION

Reference is now made to FIG. 1 comprising a photonic integrated circuit (PIC), here also referred to as a transmitter PIC or TxPIC 10 to which the features of this invention may be applied. It should be noted that some of the attributes of this invention are equally applicable to any other PICs, such as optical receiver photonic integrated circuit (RxPIC) chips which are disclosed in U.S. patent application Ser. No. 10/267,304, supra, examples of which are also discussed in later described embodiments, and any other such PICs having integrated active or electro-optic components as well as one or more passive optical components.

TxPIC chips 10 as well as such PIC chips in other embodiments disclosed are an In-based chip, various details of which are disclosed in U.S. patent application Ser. No. 10/267,331, supra. As shown in FIG. 1, monolithic PIC chip 10 comprises groups of integrated and optically coupled active and passive components formed in a series of signal channels, identified as channel Nos. 1 through 10 in FIG. 1, wherein each signal channel includes a laser source 12, such as a DFB semiconductor laser or a DBR semiconductor laser. Each laser source 12 operates at a different emission wavelength, $\lambda_1$–$\lambda_N$ where N in the exemplary embodiment here is equal to ten, where the group of wavelengths provides a wavelength grid with predefined grid channel spacing that may be commensurate with a standardized wavelength grid, such as the ITU wavelength grid. However, such a wavelength grid may also be a non-standard wavelength grid or a wavelength grid with nonuniform channel spacing. On the other hand, the wavelength grid need not be of any particular standard. Laser sources 12 are respectively provided with an associated electro-optic modulator 14 as shown in FIG. 1. Thus, the CW outputs of laser sources 12 are shown optically coupled to respective electro-optic modulators 14. Modulators 14 may be electro-absorption modulators (EAMs) or Mach-Zehnder modulators (MZMs) as detailed in patent application Ser. No. 10/267,331, supra. It is within the scope of this invention that rather deploying modulators 14, laser sources 12 may be directly modulated. Thus, channel "modulated sources" may be defined as a modulated laser source or a CW operated laser source with a modulated external modulator.

Modulators 14 each apply an electrical modulated signal to the CW light from laser sources 12 producing an optical modulated signal for transmission on an optical link of an optical transmission network. The modulated channel outputs from modulators 14 may be optically coupled to a front photodetector (FPD) 16F for the purposes of monitoring the output power or signal characteristics received from the modulators 14. The on-chip deployment of FPDs 16F is optional. FPDs 16F may also be fabricated off-axis of the channel of in-tandem optical train elements by means of an on-chip channel optical tap to provide a small portion of the modulated output to the offset photodetector. Also, shown in FIG. 1 for each signal channel are back photodetectors (BPDs) 16B for monitoring light from the back facet of laser sources to aid in or provide for the determination of laser CW output power in each signal channel. FPDs 16F and BPDs 16B may be PIN photodiodes, MSM photodetectors, or avalanche photodiodes (APDs). Also include in each signal channel is an electro-optical amplitude varying element (AVE) 15 which is illustrated in this embodiment as a variable optical attenuator (VOA). More will be said later about this element. While in this and other embodiments, the train of elements is numerically identified for only channel 1 in the figures, it should be understood in this description that they are the same for all the remaining signal channels 2 through 10.

As indicated above and as explained in more detail in patent application Ser. No. 10/267,331, supra, modulators 14 may be fabricated as electro-absorption modulators (EAMs), Mach-Zehnder modulators (MZMs) or bandedge Mach-Zehnder modulators. The modulated optical signal outputs of modulators 14, via FPDs 16F, are respectively coupled, via waveguides 18(1) . . . 18(10), to an on-chip wavelength selective combiner, shown here as an arrayed waveguide grating or AWG 20. Waveguides 18(1) . . . 18(10) receive the modulated channel signals from the N channels and provide them as an input to AWG 20. It is within the scope of this invention that combiner 20, or later on described decombiners, may be another type of wavelength-selective combiner or decombiner, as the case may be, such as Echelle gratings, cascaded Mach-Zehnder interferometers (MZIs), broadband multiplexers of the type shown, for example, in U.S. Pat. No. 6,580,844 (which is also incorporated herein by its reference), so-called free-space diffraction gratings (FSDGs) or quasi-selective wavelength star couplers having a multimode coupling region comprised of waveguides as disclosed in U.S. patent application, publication No. US2003/0012510 A1 (which patent application is also incorporated herein by its reference). The employment of such wavelength-selective combiners or multiplexers is more conducive to high channel signal counts on TxPIC chips. However, it is within the scope of this invention to practice the invention in connection with couplers, such as power couplers, star couplers or MMI couplers which can be employed in particular circumstances. Each of the laser source/modulator combinations is, therefore, representative of an optical signal channel on TxPIC chip 10 and there may be, for example, as many as forty signal channels or more on TxPIC 10. As previously indicated, there are N channels on each TxPIC chip 10 and, in the case here, ten such channels are shown as numbered one through ten in FIG. 1. There may be less than 10 channels or more than 10 channels formed on chip 10. In FIG. 1, the output of each signal channel from a respective channel laser/modulator is coupled to a respective waveguide 18(1) to 18(10) which is optically coupled to the zero order Brillouin zone input of AWG 20.

Each signal channel is typically assigned a minimum channel spacing or bandwidth to avoid unacceptable crosstalk with other optical channels. Currently, for example, 50 GHz, 100 GHz, or 200 GHz are common channel spacings between signal channels. The physical channel spacing or center-to-center spacing 28 of the signal channels may be 100 μm to 1,000 μm or more to minimize electrical or thermal cross-talk at data rates, for example, of 10 Gbit per second or greater and facilitate routing of interconnections between bondpads of multiple PIC optical components or elements. Although not shown for the sake of simplicity, bonding pads may be provided in the interior of PIC chip 10 to accommodate wire bonding to particular on-chip electro-optic components in addition to bond pad groups 13 comprising chip edge-formed bonding pads.

Metal interconnects between bondpads (not shown) and electro-optic components are at least partly formed on a surface of an isolation or passivation medium deposited over PIC chip 10. A dielectric medium is often employed to passivate and to provide for uniform planarization of the surface of chip 10. Such a passivation medium may be, for example, $SiO_x$, $SiN_x$, polyimide, BCB, ZnS, ZnSe or SOG or as combination of one or more of the foregoing mediums.

As indicated above, the respective modulated outputs from electro-optic modulators 16 are coupled into optical waveguides 18(1) to 18(10) to the input of AWG 20 as shown in FIG. 1. AWG 20 comprises an input free space region 19 coupled to a plurality of diffraction grating waveguides 21 which are coupled to an output free space region 22. The multiplexed optical signal output from AWG 20 is shown as provided to a plurality of output waveguides 23 which comprises output verniers along the zero order Brillouin zone at output face 22A of output free space region 22 of AWG 20. However, this is optional and the output may be to a single output. Output waveguides 23 extend to output facet 29 of TxPIC chip 10 where a selected vernier output 23 may be optically coupled to an output fiber (not shown). The vernier outputs may also be disposed at a small angle relative to a line normal to the plane of output facet 29 to prevent internal reflections from facet 29 back into vernier outputs 23 that may affect stabilized laser wavelength operation. The deployment of multiple vernier outputs 23 provides a means by which the best or optimum output from AWG 20 can be selected having the best match of the wavelength grid passband of AWG 20 with the established wavelength grid of the group of channel signal outputs from the array of laser sources 12. Seven vernier outputs 23 are shown in FIG. 1. It should be realized that any number of such vernier outputs may be utilized beginning with the provision of two of such vernier outputs. Also, the number of such vernier outputs may be an odd or even number.

In operation, AWG 20 receives N optical signals, $\lambda_1$–$\lambda_N$, from coupled input waveguides 18 which propagate through input free space region 19 where the wavelengths are distributed into the diffraction grating waveguides 21. The diffraction grating waveguides 21 are plurality of grating arms of different lengths, $\Delta L$, relative to adjacent waveguides, so that a predetermined phase difference is established in waveguides 21 according to the wavelengths $\lambda_1$–$\lambda_N$. Due to the predetermined phase difference among the wavelengths in grating arms 21, the focusing position of each of the signals in grating arms 21 in output free space region 22 are substantially the same so that the respective signal wavelengths, $\lambda_1$–$\lambda_N$, are focused predominately at the center portion or the zero order Brillouin zone of output face 22A. Verniers 23 receive various passband representations of the multiplexed signal output from AWG 20. Higher order Brillouin zones along output face 22A receive repeated passband representations of the multiplexed signal output at lower intensities. The focus of the grating arm outputs to the zero order Brillouin zone may not be uniform along face 22A due to inaccuracies inherent in fabrication techniques employed in the manufacture of chip 10. However, with multiple output verniers, an output vernier can be selected having the best or optimum combined WDM signal output in terms of power and responsivity.

Turning attention again to electro-optic amplitude varying elements (AVEs) 15 in FIG. 1, this element may be a variable optical attenuator (VOA) as shown in FIG. 1, but also may be a semiconductor optical amplifier (SOA), an in-series or in-tandem variable optical attenuator (VOA) and a semiconductor optical amplifier (SOA), or a combination, variable optical attenuator/semiconductor optical amplifier, which we also refer to as a ZOA, meaning that is a combined SOANOA and operates as either as a gain element or a passive element depending upon whether the applied bias is positive or negative, respectively. In FIG. 1, VOA 15 follows electro-absorption modulator (EAM) 14. In this situation, the array of VOAs 15 provide for pre-emphasis directly on chip 10 across the array of channel signals so that the output modulated signals from EAMs 14 are all approximately at the same power level upon entering the input to AWG 20. As seen in FIG. 1A, VOA 15 in each signal channel 1 to 10 can operate to change the signal amplitude in a channel by employing monitoring FPD 16F to provide an output in the form of a monitoring signal proportional to signal power to system control circuit 40 which compares the same monitoring signals from other FPDs 16F in other signal channels to provide, for example, signal attenuation to those channel signals having higher signal strength over the weakest of all such channel signals. Where such attenuation is necessary, circuit 40, as seen in FIG. 1A, provides a control signal to VOA bias control circuit 41 to respective VOAs 15 which can correspondingly reduce the channel signal strength by increasing the negative bias on VOA 15 in each signal channel. System control circuit 40 can also receive optical signal to noise (OSNR) data from an optical receiver in the optical transmission network relative to the transmitted channel signals, $\lambda_1$ to $\lambda_N$, and the OSNR can be improved by reducing or increasing the channel signal power in certain signal channels via VOA bias control circuit 41.

FIG. 1A also illustrates other control circuits for signal channel elements such as laser driver circuit 42 for controlling the bias current to LD 12 and a bias control circuit 43, zero crossing control circuit 44 and a peak-to-peak control circuit 45 that provide voltage control inputs to circuit driver 46 for modulator 14. This control circuitry is discussed in more detail in U.S. patent application Ser. No. 10/267,330, supra. As previously indicated, BPD 16B provides for feedback control via system control circuit 40 to control the bias current to laser source 12 to maintain its optical output power at a predefined output level via driver 42. In this manner, the laser sources 12 may be driven through life at a constant bias current which is helpful in separating the function of laser source output power from the function of maintaining laser source emission wavelength to a predefined value, as will be explained in more detail later.

Reference is now made to the second embodiment shown in FIG. 2 comprising TxPIC chip 10A which is identical to FIG. 1 except the electro-optic amplitude varying element (AVE) shown here in the form of variable optical attenuator (VOA) 15 is illustrated as positioned in each signal channel between laser source 12 and electro-optic modulator 14. A primary reason for placing VOA 15 before modulator 14 is that, placed in the position as illustrated in FIG. 1, VOA 15 may possibly degrade the Q quality or provide a Q penalty to the modulated signal output from modulator 14 including possibly some phase change to the signal. More will be said about this in connection with the embodiment shown in FIG. 10. Again, the system control circuit 40 may be employed in FIG. 2 as well as in other described embodiments to provide for pre-emphasis in the manner described in connection with that figure.

Reference is now made to a third embodiment of this invention in FIG. 3 comprising TxPIC chip 10B which is the same as the first embodiment in FIG. 1 except that the electro-optic amplitude varying element (AVE) illustrated here is a semiconductor optical amplifier (SOA) 19 placed in each signal channel 1 to 10 after modulator 14. The function of SOA 19 is to provide equalization across the array of $\lambda_1$–$\lambda_N$ channels by amplifying those modulated signals that are below a desired power level or to apply gain to N–1 channel signals as necessary to increase the signal gain to that of the naturally highest gain signal channel. It should be noted that with an SOA 19 or a VOA 15 provided after modulator 14, these amplitude varying elements (AVEs) may add an additional chirp to the channel modulated signal which may, in some cases, be used advantageously to predistort the signal to achieve some dispersion compensation toward improving the BER at the optical receiver across the optical transport link as well as function to apply or attenuate the channel signals.

Reference is now made to a fourth embodiment of this invention shown in FIG. 4 comprising TxPIC chip 10C which is the same as the third embodiment in FIG. 3 except that semiconductor optical amplifier (SOA) 19 placed in each signal channel before modulator 14. Care must be taken in the implementation of this embodiment that SOA 19 is not sufficiently biased as to place modulator 14 into saturation. More is said about this embodiment later on in connection with the embodiment of FIG. 11.

Reference is now made to a fifth embodiment of this invention shown in FIG. 5 comprising TxPIC chip 10D which is a combination of the first and third embodiments where both a SOA 19 and VOA 15 are placed in each signal channel after modulator 14. Their combined function increases the dynamic range for achieving gain equalization across the array of signal channels. In this regard, the functionality of the SOA and VOA can be combined into a single element which we identify as a "ZOA" in this disclosure. Such a ZOA 32 is shown at signal channel No. 10 of chip 10D in FIG. 5 and performs the function of adding or attenuating gain of the propagating channel signal. It should be understood that ZOA 32 represents a compromise over a channel AVE combination of a SOA with a VOA in that if the length of a VOA was as long as an SOA, such as illustrated by the dotted line extension 32A in FIG. 5, there would be too much attenuation per comparable unit length of a VOA and of a SOA. This is because the frequency and attenuation response of a VOA is significantly greater than the frequency and gain response of a SOA. In this embodiment, therefore, employing a ZOA 32, the comparable unit length is not as long while still providing a sufficient increase in dynamic range adjustment to more extensively adjust the signal power levels of the channels across the array. Also, ZOAs 32 are useful to apply a minimal amount of gain to the signal channel to render the device to have minimal or no insertion loss to the propagating channel signal. Because of the frequency response of ZOA 32, such a device can be easily substituted in any embodiment herein for a VOA. Since the gain aspect provided by ZOA 32 is not large, compared to SOAs by their selves, one alternative embodiment is to place a pair ZOAs 32 in each signal channel, one before and one after modulator 14, so that sufficient gain can be provide to the signal, followed by attenuation to provide equalization across the channel array, which concept is illustrated in the sixth embodiment of FIG. 7 at signal channel 10. Of course, as in this and other embodiments, these AVE elements would be included in other signal channels of the same PIC. A reason why a tandem SOA/VOA 19 and 15 or a ZOA 32 is desirable is that, with the single use of an SOA to achieve gain flattening, there is a limit as to how much amplification can be realized to perform such a gain function. The gain achieved with an SOA can be increased by making it long in length but this increases the current requirements on the PIC which may exceed the desired PIC current budget. Also, more gain in a channel induces more back reflection and scattered light in the signal channel and the amplification of these back reflections and scattered light within the channel as well, which can be detrimental to the operation of laser sources 12. ZOA 32 enhances the dynamic range of adjustment of channel gain and helps to eliminate the above problems or issues in this regard so that higher power channels can be attenuated while, concurrently, lower power channels can be amplified. Lastly, the deployment of a ZOA 32 in each channel in lieu of a combination, in-tandem VOA/SOA 15 and 19 materially reduces the number of on-chip bonding pads required, in the case here, by one set of pads per channel so that twenty bonding pads are eliminated from the design of chip 10D.

Reference is now made to a sixth embodiment of this invention shown in FIG. 6 comprising TxPIC chip 10E which is the same as the fifth embodiment in FIG. 5 except that the combination SOA 19 and VOA 15 are positioned before modulator 14. In this embodiment, when these amplitude varying elements are placed before modulator 14, they can, in combination, produce a type of signal chirp on the resulting modulated signal exiting from the modulator. VOA 15, however, cannot affect the modulator signal Q. Again, care must be taken not to drive SOA 19 too hard so as to saturate modulator 14.

Also, as in the case of the fifth embodiment in FIG. 5, a ZOA 32 may be placed before modulator as shown at signal channel 10 in FIG. 6.

FIG. 7 illustrates a further seventh embodiment comprising TxPIC chip 10F where a VOA or SOA 34 and 35 could be positioned on either side of a modulator 14 in each signal channel, or, alternatively, a VOA 34 can be positioned before modulator 14 and a SOA 35 positioned after modulator 14. The positioning of SOAs 34 and 35 on either side of modulator is also illustrated in patent application, Ser. No. 267,331, supra. These embodiments provide for an extended dynamic range to adjust for better OSNR at the optical receiver while applying some signal equalization or pre-emphasis across the array. A preferred deployment in TxPIC chip 10F is a VOA or ZOA before or after electro-optic modulator 14 and an SOA after electro-optical modulator 14. The in-tandem order in which a SOA and a VOA are placed in a PIC signal channel in the direction of channel signal propagation is determined by the best per channel BER that can be achieved without saturating the modulator.

Reference is now made to an eighth and ninth embodiment shown, respectively, in FIGS. 8 and 9 comprising TxPIC chip 10G and 10H. In FIG. 8 a single multi-functional element (MFE) 36 is placed after modulator 14 whereas in FIG. 9 a single multi-functional element (MFE) 36 is placed after modulator 14. Such a MFE element has already been disclosed and discussed in the form of ZOA 32. Such a MFE 36 may perform separate electro-optically applied functions relative to acting upon the laser source CW light output or the modulated optical signal output in each signal channel. Other examples of an element 36 performing multiple functions comprising a multi-functional element is as a variable optical attenuator (VOA) or as a photodetector (PD); as a ZOA or as a photodetector; as a ZOA or as a VOA; or as a ZOA or as a SOA. An electro-optic MFE 36 is desirable in PICs because they perform two or more functions on a channel signal in one or more integrated signal channels and can include at least two of the following functions: modulate (signal or tone frequency), amplify, attenuate, vary signal amplitude, apply a tagging frequency tone, and provide a tap to monitor power or other properties or characteristics of the channel signal. The reasons to employ such MFEs 36 in PICs are primarily two-fold. First, as separate electro-optic elements in the PIC, they would require additional space or chip real estate on the PIC. With a single element performing more than one function, less chip space is required as compared to deploying additional elements in the same chip space. Second, the use of an MFE provides for elimination at least two bond pads on the PIC chip for every on-chip electro-optic element eliminated. While such bond pads are small, PICs are pad-limited in terms of circuit layouts designed within a predetermined or proscribed chip space or area.

Reference is now made to FIG. 10 which is a specific embodiment of the ninth embodiment in FIG. 9, comprising TxPIC 10H1, and is as well one of the more preferred embodiments of the several embodiments illustrated in this disclosure. As previously noted, supra, it is preferred in one embodiment to operate all the laser sources 12 at a constant average current chosen at the beginning of life to provide a thermally stable relationship between laser sources 12 on the TxPIC which reduces the complexity of wavelength locking control of the laser sources by separating the power control function from the wavelength shifting events imposed upon laser source 12. One such event includes varying the bias current operation during laser source operation which effective also changes the laser emission wavelength. The aging changes of laser wavelength over life, which change is dominated by monotonic blue shift, can be directly compensated for by laser heater adjustment. Such heaters for laser sources 12 are illustrated in incorporated patent application, Ser. No. 10/267,330, supra. As previously noted, as a laser source ages over life, the output power of the laser changes thereby altering the incident optical power to the electro-optic modulator 14 over life in each signal channel path of the TxPIC 10. The resulting changes in photocurrent in the electro-optic modulator can shift the bias point of the electro-optic modulator 14, thereby altering its signal chirp, extinction ratio and waveform distortion with respect to conditions set optimally at the beginning of life for the on-chip modulators 14. Modulated light output from a electro-optic modulator, such as seen in the case of FIG. 1, for example, passes through the FPD 16F before on-chip multiplexing occurs at optical combiner 20. When the FPD 16F reverse bias is varied to control the individual channel power, for example, to compensate for changing laser source output power over life, the waveform created by electro-optic modulator 14 can be altered by a charge transport phenomena occurring at FPD 16F when its reverse bias is so varied. This can affect the fidelity of the transmitted waveform thereby introducing changes in the bit error rate (BER) at an optical receiver, as the FPD 16F bias changes relative to conditions set optimally at the beginning of life for the respective modulators 14. To avoid the foregoing mentioned problems, the following sequence of functional AVEs in each signal channel of the TxPIC is prescribed where, following laser source 12, the next AVE is the FPD 16F, followed by an electro-optic modulator 14 as illustrated in FIG. 10. With this sequence of integrated elements in each signal channel, particularly in the case where laser sources 12 are driven at constant bias current for improved wavelength stability as just mentioned above, laser sources 12 can be set with high bias currents to provide higher than required output powers which can then be attenuated by FPD 16F in FIG. 10 to predetermined levels of output power across the laser array so that the modulators 14 continually experience the same power level received from its corresponding laser source 12. Changes of laser source output power occurring over life, such as, monotonic deceasing power over life, can be compensated for by changing the FPD insertion loss by reducing the applied bias to the FPD 16F, resulting in approximately constant channel output power across the signal channel array as well as resulting in approximately constant input power to the respective electro-optic modulators over life. In this manner, the conditions that optimize transmission performance at beginning of life remain approximately unchanged over the life of the TxPIC. Additionally, the modulated light output from electro-optic modulators 14 only propagates through subsequent passive optical elements in the TxPIC architecture, e.g., the optical combiner 20, thereby avoiding possible waveform degradation associated with charge transport phenomena brought on by a downstream AVE channel element, such as a photodetector, i.e., channel downstream of an electro-optic modulator 14. Thus, through this architecture, channel power control is made more independent from interaction with waveform generation (digital or analog modulation) utilized for data transport through modulation of modulator 14.

Also, any back reflection from a channel imperfections or from a channel experiencing a fabricated butt joint, such as the one shown at dashed line 47 in FIG. 10 (which is purely exemplarily of one of many different places in the TxPIC where a butt joint may occur), is formed during circuit fabrication existing along the channel path can be circumvented with improved optical isolation of the laser source. In some fabrication techniques utilizing MOCVD, for example, with selective area growth or SAG or etch back and then layer regrowth, a butt joint may be formed between the front photodetector (FPD) and the electro-optic modulator or between the modulators 14 and the optical combiner 20 as in the case in FIG. 10. There are other examples of such formed butt joints that may be formed in "stop and then regrow" techniques along the signal channels formed in a TxPIC. In any case, the insertion loss of FPD 16F provided at the laser source output and before the modulator input can aid to isolate the laser source 12 from such butt joint back reflections as well as from the affects of the now-modulated back reflections passing through a signal channel electro-optic modulator from a downstream butt joint at 47 which are then attenuated by FPDs 16F in FIG. 10. Depending upon the position of the butt joint 47 in the PIC, the isolator 39 may be positioned in each signal channel between said laser source and said SOA, or between said SOA and said modulator, or after said modulator. Thus, the MFE in the form of a FPD 16F in the position shown in FIG. 10 can perform a plurality of tasks: (1) provide constant power output uniformity across the channel array over laser source or PIC life; (2) substantially protect of the laser source 12 from back reflected light in the channel, such as from butt joints at 47 or other back reflection caused by fabrication protobations in the PIC circuit; (3) monitor the laser source output power to make sure it remains at a constant level to the modulator input as the laser sources age over life; (4) in the case of the FPD 16F, being directly after the laser source 12, allows monitoring of its power at higher level photocurrents than compared to the case where the modulator 14 intercedes, i.e., compared to the case where the FPD 16F is at the output of the modulator 14 (Higher photocurrent levels relative to dark and leakage currents of the PD improves accuracy of the estimation of laser source forward output power when the FPD 16F is in the positions shown in FIG. 10 compared to the positions shown in FIG. 1, with or without the VOAs shown in FIG. 1.); and (5) take on a low frequency modulation, also referred to as a tone frequency, that provides a tag identification of the channel output signal for purposes, inter alia, of deployment in a feedback wavelength stabilization control system as taught in Pub. No. US2003/0095736 A1, supra, and as taught in U.S. provisional patent application Ser. No. 60/695,382, filed Jun. 30, 2005 and entitled, "WAVELENGTH LOCKING AND POWER CONTROL SYSTEMS IN MULTI-CHANNEL PHOTONIC INTEGRATED CIRCUITS (PICs)", and its later-to-be filed nonprovisional application, all of these applications being incorporated herein by their reference.

Instead of a FPD 16F, a VOA may be employed per channel between the laser sources 12 and modulators 14 in chip 10H1, as also previously illustrated in connection with the embodiment shown in FIG. 2. Therefore, to control laser output power to be constant for purposes of equalization across the channel array of the TxPIC 10 or 10H1 as well as insuring constant power input level to associated modulators 14 over life, a VOA may be employed in place of a FPD in FIG. 10. In such a case, the function of power monitor is not performed in the several tasks mentioned above with respect to the FPDs 14F. With a VOA place before modulators 14 in each channel, the input power of the modulators 14 can be maintain in a constant state thereby avoiding large photocurrent changes to occur in the modulator due to laser source power level changes in its input power as well as be possibly affected by associated saturation phenomena.

Reference is now made to FIG. 11 which is similar to the second embodiment of FIG. 4, but is a modified embodiment over FIG. 4 through the deployment in TxPIC chip 10A1 of a per channel optical waveguide isolator (OWI) 39 and SOA 36A after laser source 12 and before modulator 14. In the embodiment here, an SOA 36A is employed for equalizing the power output level across the laser array rather than a VOA. In the case here, back reflections in the signal channels due to previously mentioned imperfections as well as from a butt joint, such as at 47 in FIG. 11, will now be modulated backward through modulator 14 and then amplified by SOA 36A. This can be detrimental to the optical spectrum operation of laser source 12 and the maintenance of its desired emission wavelength. Thus, a per channel optical waveguide isolator (OWI) 39 is inserted between the outputs of laser sources 12 and SOAs 36A as seen in FIG. 11. Examples of such isolators or the principals of their operation as integrated in PIGs, which are also meant here to include, as a group, back reflection optical channel deflectors to deflect undesired back reflected light from the channel path, are illustrated in U.S. Pat. Nos. 4,691,983; 4,973,119; 5,428,695; 5,463,705; and 5,663,824, which patent are incorporated herein by their reference.

The deployment of constant average current operation of a TxPIC requires, therefore, separate power control of each signal channel using an on-chip, integrated variable power control elements, such as, a high dynamic range gain element, such as a per channel SOA, or a high dynamic range loss element, such as a per channel VOA, or both in the form of a VOA, to provide for power flattening at the TxPIC output as well as constant optical power input to the modulators.

If the constant average current approach is employed where the start-of-life output power from the TxPIC laser sources 12 commences with initial, substantially highest power laser output, and then, a per channel VOA may be employed as the power control element to correspondingly attenuate all laser source power outputs to the same power level. As the laser sources age, the lasers will continually lose power so that the reverse bias depth of the VOAs is withdrawn to continually maintain the same laser source output power to the modulator. Also, in this case of operating at initial, substantially highest optical loss deprivation applied by the VOAs to the substantially highest laser output powers via constant average current operation over life, the amount of optical loss across the array is based from the array channel with the weakest total output power. On the other hand, if SOAs are employed for power flattening, then, the gain provided in each channel SOA allows an increasing of the power from the weakest of such array channel or channels up to the power level of the strongest channel power level in the channel array. However, in this case, the per channel SOAs add noise to the channel signals and will introduce signal waveform distortion and further signal chirp and, correspondingly, increasing the channel BER, particularly in the case where the per channel SOA follows the channel modulator, as seen in the embodiment of FIG. 3. However, this increase in BER at the optical receiver can be counteracted with the use of FEC encoding of the transmitted channel signals as combined into a PIC WDM output signal.

Reference is now made to a tenth embodiment of this invention which is illustrated in both FIGS. 12 and 13.

TxPIC chip 50 in FIG. 12 is similar to previous embodiments in including an AVE or MFE either at the input or output of modulators 14, or both, but, further, includes on-chip electro-optic elements A at 52 and B at 54 in output waveguide 23 between the output of combiner 20 and output facet 29. Elements 52 and 54 are for the purpose of providing attenuation to the optical signal group (OSG) on output waveguide 23 of chip 50. As shown in FIG. 13, a plurality of TxPICs 50 may be provided in a single transmitter module 55 with each chip 50 having N signal channels. In the example shown here, N is equal to 10 so that transmitter module 55 includes one hundred signal channels. The WDM outputs on lines 51 from these ten TxPIC chips 10 are combined or interleaved in combiner/interleaver 56 for output on optical link 58 as a single WDM signal. A booster optical amplifier 57 may be provided at this output to provide gain to the signal before transmission on link 58. Amplifier 57 may be a rear earth doped fiber amplifier or one or more cascaded semiconductor optical amplifiers depending upon the amount of desired gain to be provided to the WDM signal. In the configuration shown in FIG. 13, it is desired that all the outputs from the ten TxPIC chips 50 are of substantially the same power level, i.e., they are at the same output power across output line 55 across the array of TxPICs 50. The natural power level from chip-to-chip will not necessarily be the same even in the case of power equalization or pre-emphasis provided with an AVE or MFE channel element 37 because of the difference in power consumption and insertion losses among the several chips 50. In order to achieve pre-emphasis at chip 50 outputs, amplitude adjustment of the just-combined WDM signal on each chip can be adjusted by one or more elements 52 and 54 so that the resultant power across all chip outputs at 51 will be substantially the same. Thus, the purpose of the output electro-optic elements 52 and 54 are to attenuate, or attenuate or amplify, i.e., provide amplitude adjustment on the optical signal group (OSG) WDM signal from TxPICs 50 over a sufficiently wide dynamic range so that the output of the multiple TxPIC chips 50 in transmitter module 55 can be rendered to have substantially equalized outputs prior to their presentations at interleaver or combiner 56.

For the purposes of this disclosure, one or both such electro-optic elements A or both A and B may be utilized in waveguide 23. Electro-optic elements 52 and 54 are preferably at least one phase modulator or a combination of at least one phase modulator and an SOA, or, respectively, a VOA and an SOA. It is preferred, however, not to employ electro-absorption-based VOAs because of their bandedge phenomena which may adversely affect the WDM signal by applying too much insertion loss. The purpose of two elements 52, and 54 is to achieve a larger dynamic range such as in the range, for example, of approximately 30 dB to 35 dB. Specific options include element 52 comprising a Mach-Zehnder interferometer (MZI) or multi-mode interference (MMI) switch and element 54 is absent. Another option is both elements 52 and 54 comprising a Mach-Zehnder interferometer (MZI) or multi-mode interference (MMI) switch. Another option is element 52 comprises an SOA or a gain clamped-SOA (GC-SOA) and element 54 comprises a Mach-Zehnder interferometer (MZI) or multi-mode interference (MMI) switch or visa versa. A further option is that both elements 52 and 54 comprise in-tandem gain elements comprising SOAs or GC-SOAs toward increasing chip 50 outputs to a common power level across the array of chips 50 in module 55. A further option is that both elements are tandem VOAs increasing the dynamic range toward reducing chip outputs to a common power level across the chip array in module 55. A last option is that one or both elements 52 and 54 can be a MFE of the type as previously defined and discussed. The MZI versions of the foregoing options for attenuation can be employed to attenuate via either the electroabsorption effect or via signal interference provided at the MZI Y-coupled output.

In all the foregoing options, the deployment of electro-optic elements 37 for at least some signal channels to include an amplification function is desired because it can compensate for any insertion loss brought about later by electro-optic elements 52 and 54, except in the case where these elements 52 and 54 are purely gain elements, e.g., in tandem SOAs. Further, if chip elements 37 are gain elements, such as SOAs, the option where elements 52 and 54 are purely gain elements is not highly desirable although possible, because the launch power from chip 50 may to be too high. Also, in FIG. 12, in the case where one of the elements 52 or 54 is a Mach-Zehnder interferometer (MZI), there will result a gain tilt established across the channel signal spectrum since such interferometer elements are wavelength sensitive. In this embodiment, it is preferred that VOAs are employed at 37 in each channel waveguide at the input or output of channel modulators 14 so that an opposite gain tilt can be set across the channel signal spectrum to compensate for the gain tilt that will occur on the optical signal group (OSG) signal at the MZI element 52 in the chip output waveguide 23.

In summary relative to the embodiment of FIGS. 11 and 12, TxPIC chip 50 is to deploy an amplitude adjustment on the WDM output signal or the optical signal group (OSG) signal from each TxPIC chip 50. The respective signals combined by multiplexer 20 have all been substantially flatten or equalized by means of dynamic adjustment of a AVE or MFE at 37 as explained in the previous described embodiments of these integrated elements. However, the power levels of one OSG signal to the next on module output lines 51 (FIG. 13) may be different. Thus, it is desirable to equalize the OSG outputs in lines 51 over all of the TxPICs 50 before their OSG signals are combined or interleaved. Thus, as seen from FIG. 13, if more than one OSG output is to be combined with a plurality of other OSG outputs from other TxPIC chips 50 in a single transmitter module 55, it is desirable that there be an amplitude adjustment at the PIC WDM signal output to substantially equalize the OSG outputs among the plural TxPIC chips. Several such embodiments to accomplish this amplitude adjustment have been discussed in connection with FIG. 12. Also, the same amplitude adjustment may be employed for optical circuit startup where the output from the TxPIC chips would be attenuated to prevent any startup signal testing or calibration signal from being transmitted from chips 50 onto optical link 58.

Reference is now made to a multi-signal channel, optical receiver photonic integrated circuit (RxPIC) chip 140A comprising the eleventh embodiment of this invention which is shown in FIG. 14. Monolithic chip 140A comprises an input waveguide 145 for receiving a WDM signal at input 139 where the signal may be amplified by optional amplifier 142 which may be, for example, a SOA or a GC-SOA. The WDM signal is then passed onto decombiner 144 which is shown here as an arrayed waveguide grating (AWG) comprising input slab or free space region 146 and an output slab or free space region 150 between which is an array of grating arms 148 of different, increasing lengths, $\Delta L$, so that a predetermined phase difference is established in waveguides 21 according to the wavelengths $\lambda_1$–$\lambda_N$ combined in the incoming WDM signal. The output from output free space region 150 comprises a plurality of separated or demultiplexed channel signals $\lambda_1$ to $\lambda_N$, here N=12, are respectively provided on a plurality of output waveguides 154 to a plurality of amplitude varying elements 153, shown here as VOAs 153, followed optionally by another electro-optic element 157 and lastly to a corresponding photodetector (PD) 152, shown here PDs 152(1) ... 152(12). Also, a higher order output from output free space region 150 may optionally be provided via waveguide 154 to a monitoring photodiode (MPD) 156 for monitoring the output from AWG 144. Elements 157 are integrated passive polarization dependent loss or gain (PDL/PDG) elements which are shown following each VOA 153 in each signal channel but, also, may be alternatively positioned before each VOA 153. Such PDL/PDG elements 157 are passive absorbing regions formed in waveguides 151 to provide for more absorption for one polarization mode over another. More will be said about this below. The different channel signals exiting AWG 144 will have different intensities due to the different anomalies or imperfections of the chip, for example, such as varying insertion losses of the AWG 144 and associated waveguides 151. It is important to that the channel signals reach PDs 152 at the same power level providing similar results as well as sufficiently attenuated so that they do not saturate either PDs 152 or the transimpedance amplifies (TIAs) 200, the latter of which is seen in FIG. 16.

As illustrated in FIG. 16, each VOA employs per channel information from a corresponding transimpedance amplifier (TIA) 200 coupled to the output of each photodetector 152, for example, to set the bias value of VOA 153 to insure that each channel signal remains within the dynamic range of the optical receiver and does not saturate either photodetector 152 or TIA 200. As a result, the optical transmission system connected to the optical receiver can afford far greater dynamic range variations when the on-chip VOA attenuation is employed thereby extending the signal reach by improving the OSNR and/or reducing the amount of control, necessary specifications and costs of the optical transmission system in the optical receiver. VOA 153 is operated with a reverse bias applied to optimize the dynamic range for each channel signal. The attenuation reduces the noise floor rendering the TIA to more definitively define the sinusoidal or square voltage output from the photodetectors representative of binary values of 1 and 0 in the electrical signal. VOAs 153 may be an electro-absorption type of VOA, a bandedge type of VOA or may be a Mach-Zehnder phase type of VOA. Also, photodetector 152 may be a bandedge type where the VOA is also a bandedge type. A bandedge VOA functions like a reverse bias PIN photodiode which operates in the region of its bandedge. The VOA may also have a shifted bandgap in its active region so that the amount of signal loss accomplished by a given applied negative voltage will be enhanced. Further, the VOA may be a combination semiconductor optical amplifier/variable optical attenuator (SOA/VOA), or ZOA, where a ZOA is a single electro-optic component designed to operate either as an optical amplifier (SOA) or an optical attenuator (VOA) depending upon the bias sign applied to the ZOA. A ZOA provides for even greater enhancement of the optical receiver dynamic range as well as sensitivity compared to either a VOA or SOA employed by itself. It is within the scope of this invention that AVEs 153 may also be multi-functional elements (MFEs) as described in connection with the embodiments, for example, disclosed in FIGS. 8 and 9.

Thus, VOAs 153 in RxPIC chip 140A are employed in the output lines to the array of PDs 152 to attenuate the individual channel signals for better responsivity at PDs 152 and at TIAs 200 and also to compensate for any gain tilt across the channel signal spectrum. The goal is to ensure that the responsivity of PDs 152 is substantially uniform across the PD array so that the array responsivity profile is flat. Then, over the life of the RxPIC chip, dynamic adjustment can be made to the bias of the respective VOAs 153 to continually maintain the flat profile. In the case here, it is important to monitor the photocurrent level per RxPIC channel so that their responsivity is substantially at all of the same detection level as well as preventing any one channel signal power from saturating either PD 152 or TIA 200, as already indicated above. Also, VOAs 153 may be employed to compensate for gain tilt of an optical amplifier external of chip 140A provided just prior to its input 139 such as illustrated in FIG. 16 at 138. Such an optical amplifier may be, for example, an EDFA, which has a set gain tilt that stays substantially the same through life. The on-chip VOAs 153 may be individually and selectively biased to compensate for this gain tilt across the channel signal spectrum and provide for the gain across the signal spectrum to be uniform at the outputs of VOAs 153. With this being the initial adjustment of biasing of VOAs 153, further changes can be then made to selective VOA applied biases to provide for flat uniformity in responsivity across the PD array. Also, if there is any loss differences introduced across waveguides 151 from AWG 144 due to varying butt joint losses for example, in forming different on-chip active regions for VOAs 153 and/or for PDs 152, this loss can be compensated for and bring uniformity responsivity across the PD array 152(1) . . . 152(12) through adjusting of the bias of VOAs 153. Lastly, loss due to shifts in the frequency response of AWG 144 resulting in different losses in different signal channels can also be compensated for by adjusting the bias of VOAs 153. The aforementioned VOAs 153 and PDs 152 having different active layers is accomplished by employing SAG for the growth of one or both of these two elements to etch back selective areas of semiconductor layers of the PIC and then regrow their respective active and confining layers. This approach may be more desired when deploying avalanche photodiodes (APDs) as photodetectors 153 in chip 140A because it may be preferred to incorporate at least one butt joint in the growth of RxPIC chips 140A in order to grow an additional layer comprising the multiplication layer required for APDs.

Reference is again made to the utilization of an input optical amplifier prior to reception of a WDM signal at an optical receiver in an optical communication network. As previously indicated, such an optical amplifier 138, shown in FIG. 16, is customarily an EDFA, but may also be an SOA. It is desirable to employ a variable gain EDFA since the adjustment of amplifier gain over time may be necessary to maintain a flat profile across the signal channel spectrum. These types of amplifiers, however, are quite expensive. On the other hand, with the employment of on-chip VOAs 153, a fixed gain EDFA 138 may be employed, instead of a variable gain EDFA, at the input to RxPIC chip 140A. Such an optical amplifier is much less expensive than a variable gain EDFA. In this way, if there is any tilt in the gain across the signal spectrum, the tilt can be compensated by VOAs 153 in the waveguide channels to PDs 152. Also, in employing VOAs 153, much larger signal dispersion can be tolerated within given OSNR limits. Thus, if the incoming signal has a sufficiently large OSNR, the dynamic range of VOAs 153 is sufficient to adjust for PD 152 responsivity and flatness across the incoming demultiplexed channel signals as well as be within the dynamic range of TIA 200. Also, this dynamic range can be extended by employing an SOA 158 followed by a VOA 153 in each channel waveguide 151 as seen in the thirteenth embodiment of RxPIC 140C seen in FIG. 17. Alternatively, a ZOA may be employed in lieu of these two tandem electro-optic elements. In this case where a combination of an SOA and VOA is employed, as long as the OSNR is at an acceptable minimum, the on-chip VOAs 153 may be utilized to flatten the signals across the signal spectrum within the dynamic range of TIAs 200 without imposing any flatness criteria on the channel waveguide SOAs 158.

In the embodiment of FIG. 14, employing a single SOA or a GC-SOA 142 for amplification across all the WDM signal channels, there will be a polarization dependent loss (PDL) or gain (PDG) varying from channel to channel at the outputs onto waveguides 151 from optical decombiner 144. We refer to such kind of optical amplifier device 142 as an optical signal group (OSG) amplifier as compared to embodiments where there may be, for example, a single SOA in each signal channel waveguide, such as a SOA employed in each decombiner output waveguide 151. To compensate for this PDL or PDG, one approach is to vary the width of VOAs 153 along their length in order to compensate for polarization loss where their respective widths depend upon the amount of polarization variation to more effectively balance or compensate the amount of either the TM mode or the TE mode to more effectively be equal to one another. Thus, this embodiment comprises the use of chirping of VOA widths to create PDL or PDG skew across the VOA array to compensate for per channel signal variation from channel to channel due to the polarization tilt that is introduced by an on-chip OSG amplifier 142. These fixed, chirped amounts of VOA widths can be characterized from a previous fabrication and testing of outputs from initially manufactured RxPIC chips 140A. As previously mentioned, another way of compensating for this PDL or PDG is to utilize integrated passive PDL/PDG elements 157 before and/or after each VOA 153 in each channel output waveguide 151. Such passive elements 157 may be an element that is more absorbent of one mode over the other mode. Such absorption quantity can be determined after characterization of previously fabricated RxPIC chips 140A to determine the width and/or length of such integrated mode absorption elements.

Reference is now made to the twelfth embodiment of this invention as shown in FIG. 15 for RxPIC 140B. The embodiment of FIG. 15 is the same as FIG. 14 except that, instead of just the deployment of VOAs 153, ZOAs 155, as previously defined herein, may be utilized which would provide greater dynamic range for signal responsivity through a greater range of dynamic range adjustment via positive and negative bias adjustment of such ZOAs. It is also within the scope of this invention to deploy only SOAs at 155, as seen in FIG. 16, but is a less likely preferred embodiment. In either case, the foregoing mentioned ways of dealing with PDL or PDG in the embodiment of FIG. 14 may be utilized in the embodiment of FIG. 15 with passive PDL/PDG elements 157 which are also alternatively illustrated in FIG. 15.

As shown in FIG. 16, the photocurrent output from PD 152 is provided to TIA 200 which provides an output voltage signal, $V_S$, representing, in electrical form, the modulated channel signal. A portion may be provided as feedback to control circuit 202 to provide a control signal to VOA 153 to control the attenuation level of the VOA 153, the gain level of an SOA, or the level of a ZOA 155, for optimum responsivity at PD 152 while preventing PD saturation.

Also, it is within the scope of this invention to provide RxPIC 140 to be a coolerless RxPIC, that is, there is no direct control over the temperature of the chip such as with a thermal electric cooler (TEC) and, in fact, chip 140 may be heated to higher operating temperatures, such as, for example, somewhere in the temperature range of 30° C. to 85° C. More on such coolerless PIC chips is disclosed in U.S. nonprovisional application Ser. No. 11/106,875, filed Apr. 15, 2005, which application is incorporated herein by its reference. In this case, temperature sensors may be provided at each VOA 153 to detect the temperature of each per channel VOA to control its temperature of operation and thereby control its attenuation properties over a wide temperature range. In this connection, see U.S. Pat. No. 6,661,963, which is also incorporated herein by its reference.

In another embodiment of this invention, rather than VOAs 153 and PDs 152 possibly having different bandgap active regions that may be provided by employing SAG techniques, VOAs 153 and PDs 152 may share the same active region which is not ideal situation for their respective operations. The goal is that PDs 152 to have high absorption and a preferred way to accomplish this is to add additional detection length to PDs 152. However, the longer their lengths, the slower their responsivity. In any case, since these two elements, VOAs 153 and PDs 152, share the same active layer or region, their operation might result in too much of an ON-state operation at VOAs 153 which can result in insufficient signal absorption at PDs 152. Where these elements share, in integration, the same active layer or region, there needs to be a balance between obtaining sufficient absorption in the array of PDs 152 but a sufficiently small ON-state absorption loss at the array of VOAs 153 while still providing a sufficient dynamic range of VOA operation that is useful in setting the dynamic range of the overall optical transmission system to provide tolerable BER performance at the optical receiver. There are, basically, two ways to solve this balancing issue. One way of accomplishing this is with the standard detector design where a balance is employed with short-length integrated VOAs 153 and applying a sufficiently large bias to them to achieve the desired dynamic range even if the operation of the VOA is above its bandedge. Also, the PDs 152 are sufficiently made longer in length to provide sufficient responsivity required to achieve discriminating data interpretation. Where, as in the case here, VOAs 153 and PDs 152 share the same active layer or region, the photoluminescence bandgap or active layer wavelength, $\lambda_{AL}$, is designed to be much less than the largest signal channel wavelength, $\lambda_i$, being transported through waveguides 151 on RxPIC 140 that each include these two serially integrated electro-optic elements 152 and 153, i.e., $\lambda_{AL} \ll \lambda_i$. In this case, VOAs 153 are operated in the absorption tail of their absorption spectrum and, therefore, independent of channel signal wavelength operation.

A second way of accomplishing this balancing is with the bandedge detector design, using the absorption effect where $\lambda_{AL} \approx \lambda_i$, by operating the VOAs near their bandedge so that the absorption of the VOAs 153 can be effective swept in and out to provide a low ON-state with a high extension ratio within the operating signal bandwidth while biasing the PDs 152 deep enough to achieve sufficient signal responsivity. In this case, operation of VOAs 153 may not be in the absorption tail so that part of the VOA operating range is deployed for compensating for varying responsivity at PDs 152. In this approach, there is more flexibility in the designed length of VOAs 153 in waveguides 151 because there is less ON-state loss and, ideally, potentially more dynamic range of operation. The tradeoff is likely that the PDs 152 must be either biased deeper or be designed of longer length or, alternatively, sacrifice some level of PD responsivity. It should be understood that for photodetectors (PDs), either PIN photodiodes or avalanche photodiodes (APDs) may be employed in these several embodiments of the invention as set forth in FIGS. 12–15, as previously indicated.

While the invention has been described in conjunction with several specific embodiments, it is evident to those skilled in the art that many further alternatives, modifications, and variations will be apparent in light of the foregoing description. For example, some of the embodiments in the future can be made through silicon technology as this technology continually develops to provide light emitting devices, such as lasers, passive devices such as arrayed waveguide gratings (AWGs) and Echelle gratings and other electro-optic devices integrated into a photonic integrated circuit. Thus, the invention described herein is intended to embrace all such alternatives, modifications, applications and variations as may fall within the spirit and scope of the appended claims.

What is claimed is:

1. A monolithic photonic integrated circuit (PIC) comprising:
   an integrated array of electro-optic elements formed as a plurality of signal channels in the circuit, each signal channel including at least a laser source, an electro-optic modulator and an electro-optic amplitude varying element (AVE); and
   a bias current applied to said electro-optic amplitude varying element (AVE) in each signal channel which is varied so that a power output level across the channel array is substantially uniform.

2. The monolithic photonic integrated circuit (PIC) of claim 1 wherein said electro-optic amplitude varying element (AVE) in each signal channel comprises a variable optical attenuator (VOA), a semiconductor optical amplifier (SOA), an in-series variable optical attenuator (VOA) and a semiconductor optical amplifier (SOA), or a combination variable optical attenuator/semiconductor optical amplifier (ZOA).

3. The monolithic photonic integrated circuit (PIC) of claim 1 wherein said electro-optic amplitude varying element (AVE) is at an output of the electro-optic modulator in each of said signal channels.

4. The monolithic photonic integrated circuit (PIC) of claim 1, further comprising a first electro-optic amplitude varying element (AVE) between the laser source and the electro-optic modulator in each of said signal channels and a second electro-optic amplitude varying element (AVEs) at an output of the electro-optic modulator in each of said signal channels.

5. The monolithic photonic integrated circuit (PIC) of claim 4 wherein said first and second electro-optic amplitude varying elements (AVEs) in each signal channel are variable optical attenuators (VOAs).

6. The monolithic photonic integrated circuit (PIC) of claim 4 wherein said first and second electro-optic amplitude varying elements (AVEs) in each signal channel are, in one case, a variable optical attenuator (VGA) and in the other case, a semiconductor optical amplifier (SOA).

7. The monolithic photonic integrated circuit (PIC) of claim 1 wherein said laser sources comprise DFB laser or DBR lasers.

8. The monolithic photonic integrated circuit (PIC) of claim 1 wherein said electro-optic modulators are electro-absorption modulators or Mach-Zehnder modulators.

9. The monolithic photonic integrated circuit (PIC) of claim 1 further comprising in the circuit an optical combiner coupled to receive the modulated optical signals from said signal channels and combine them into one WDM signal at an output of the circuit.

10. The monolithic photonic integrated circuit (PIC) of claim 9 wherein said optical combiner is selected from the group consisting of arrayed waveguide grating (AWG), an Echelle grating, a cascaded Mach-Zehnder interferometer, quasi-selective wavelength star coupler, a power coupler, a star coupler and a multi-mode interference (MMI) coupler.

11. The monolithic photonic integrated circuit (PIC) of claim 9 wherein said electro-optic amplitude varying element (AVE) comprises a variable optical attenuator (VOA), a semiconductor optical amplifier (SOA), an in-series variable optical attenuator (VOA) and a semiconductor optical amplifier (SOA), or a combination variable optical attenuator (VOA) and a semiconductor optical amplifier (SOA) or ZOA.

12. The monolithic photonic integrated circuit (PIC) of claim 11 wherein said electro-optic amplitude varying element (AVE) is at an output of the electro-optic modulator in each of said signal channels.

13. The monolithic photonic integrated circuit (PIC) of claim 11 wherein said electro-optic amplitude varying element (AVE) is between the laser source and the electro-optic modulator in each of said signal channels.

* * * * *